(12) United States Patent
Samuelson et al.

(10) Patent No.: US 10,263,149 B2
(45) Date of Patent: Apr. 16, 2019

(54) NANOSTRUCTURED LED ARRAY WITH COLLIMATING REFLECTORS

(71) Applicant: QUNANO AB, Lund (SE)

(72) Inventors: Lars Ivar Samuelson, Malmo (SE); Bo Pedersen, Lund (SE); Bjorn Jonas Ohlsson, Malmo (SE); Yourii Martynov, Geldrop (NL); Steven L. Konsek, Washington, DC (US); Peter Jesper Hanberg, Soborg (DK)

(73) Assignee: QUNANO AB, Lund (SE)

( * ) Notice: Subject to any disclaimer, the term of this patent is extended or adjusted under 35 U.S.C. 154(b) by 487 days.

(21) Appl. No.: 14/664,158

(22) Filed: Mar. 20, 2015

(65) Prior Publication Data

US 2015/0333225 A1 Nov. 19, 2015

Related U.S. Application Data

(60) Division of application No. 12/451,911, filed as application No. PCT/SE2007/001174 on Dec. 27, 2007, now abandoned, which is a continuation-in-part of application No. 11/812,225, filed on Jun. 15, 2007, now Pat. No. 8,183,587.

(30) Foreign Application Priority Data

Dec. 22, 2006 (SE) ..................................... 06028419
Jan. 12, 2007 (SE) ..................................... 07001027
Oct. 26, 2007 (SE) ..................................... 07024045

(51) Int. Cl.
*H01L 33/24* (2010.01)
*H01L 33/00* (2010.01)
(Continued)

(52) U.S. Cl.
CPC .............. *H01L 33/24* (2013.01); *B82Y 10/00* (2013.01); *B82Y 20/00* (2013.01); *B82Y 30/00* (2013.01);
(Continued)

(58) Field of Classification Search
CPC ......... H01L 33/24; B82Y 10/00; B82Y 20/00; B82Y 30/00
(Continued)

(56) References Cited

U.S. PATENT DOCUMENTS 4,287,427 A * 9/1981 Scifres ................ G01N 21/431
250/577
5,196,396 A 3/1993 Lieber
(Continued)

FOREIGN PATENT DOCUMENTS

EP 0443920 8/1991
EP 0544408 A2 6/1993
(Continued)

OTHER PUBLICATIONS

Abramson et al., "Fabrication and Characterization of a Nanowire/Polymer-Based Nanocomposite for a Prototype Thermoelectric Device", *Journal of Microelectromechanical Systems*, vol. 13, No. 3, Jun. 2004, pp. 505-513.
(Continued)

*Primary Examiner* — Ori Nadav
(74) *Attorney, Agent, or Firm* — The Marbury Law Group PLLC

(57) ABSTRACT

The present invention relates to nanostructured light emitting diodes, LEDs. The nanostructure LED device according to the invention comprises an array of a plurality of individual nanostructured LEDs. Each of the nanostructured LEDs has an active region wherein light is produced. The nanostructured device further comprise a plurality of reflectors, each associated to one individual nanostructured LED (or a group of nanostructured LEDs. The individual reflectors has a concave surface facing the active region of the respective individual nanostructured LED or active regions of group of nanostructured LEDs.

8 Claims, 11 Drawing Sheets

(51) Int. Cl.
*H01L 33/08* (2010.01)
*H01L 33/46* (2010.01)
*B82Y 20/00* (2011.01)
*B82Y 30/00* (2011.01)
*H01L 33/20* (2010.01)
*B82Y 10/00* (2011.01)
*H01L 29/06* (2006.01)
*H01L 33/18* (2010.01)
*G02B 6/10* (2006.01)
*H01L 33/44* (2010.01)
*H01L 33/60* (2010.01)

(52) U.S. Cl.
CPC ...... *H01L 29/0665* (2013.01); *H01L 29/0673* (2013.01); *H01L 29/0676* (2013.01); *H01L 33/005* (2013.01); *H01L 33/08* (2013.01); *H01L 33/20* (2013.01); *H01L 33/46* (2013.01); *G02B 6/107* (2013.01); *H01L 33/18* (2013.01); *H01L 33/44* (2013.01); *H01L 33/60* (2013.01); *H01L 2933/0025* (2013.01)

(58) Field of Classification Search
USPC ........ 438/22, 29, 34, 35, 39–45; 257/59, 79, 257/84, 88
See application file for complete search history.

(56) References Cited

U.S. PATENT DOCUMENTS

| | | |
|---|---|---|
| 5,252,835 A | 10/1993 | Lieber et al. |
| 5,332,910 A | 7/1994 | Haraguchi et al. |
| 5,362,972 A | 11/1994 | Yazawa et al. |
| 5,381,753 A | 1/1995 | Okajima et al. |
| 5,544,617 A | 8/1996 | Terui et al. |
| 5,606,181 A | 2/1997 | Sakuma et al. |
| 5,840,435 A | 11/1998 | Lieber et al. |
| 5,858,862 A | 1/1999 | Westwater et al. |
| 5,897,945 A | 4/1999 | Lieber et al. |
| 5,899,734 A | 5/1999 | Lee |
| 5,976,957 A | 11/1999 | Westwater et al. |
| 5,997,832 A | 12/1999 | Lieber et al. |
| 6,130,142 A | 10/2000 | Westwater et al. |
| 6,130,143 A | 10/2000 | Westwater et al. |
| 6,159,742 A | 12/2000 | Lieber et al. |
| 6,190,634 B1 | 2/2001 | Lieber et al. |
| 6,239,434 B1 | 5/2001 | Brown |
| 6,252,894 B1 | 6/2001 | Sasanuma et al. |
| 6,307,241 B1 | 10/2001 | Awschalom et al. |
| 6,340,822 B1 | 1/2002 | Brown et al. |
| 6,455,340 B1 | 9/2002 | Chua et al. |
| 6,559,468 B1 | 5/2003 | Kuekes et al. |
| 6,586,965 B2 | 7/2003 | Kuekes |
| 6,596,377 B1 | 7/2003 | Hersee et al. |
| 6,693,021 B1 | 2/2004 | Motoki et al. |
| 6,709,929 B2 | 3/2004 | Zhang et al. |
| 6,716,409 B2 | 4/2004 | Hafner et al. |
| 6,743,408 B2 | 6/2004 | Lieber et al. |
| 7,161,189 B2 | 1/2007 | Wu |
| 7,303,631 B2 | 12/2007 | Conley, Jr. et al. |
| 7,309,621 B2 | 12/2007 | Conley, Jr. et al. |
| 7,335,908 B2 | 2/2008 | Samuelson et al. |
| 7,354,850 B2 | 4/2008 | Seifert et al. |
| 7,445,742 B2 | 11/2008 | Chen et al. |
| 7,833,811 B2 | 11/2010 | Han et al. |
| 8,049,203 B2 | 11/2011 | Samuelson et al. |
| 8,227,817 B2 | 7/2012 | Pedersen et al. |
| 8,691,011 B2 | 4/2014 | Samuelson et al. |
| 2002/0084462 A1 | 7/2002 | Tamai et al. |
| 2002/0129761 A1 | 9/2002 | Takami |
| 2002/0130311 A1 | 9/2002 | Lieber et al. |
| 2002/0172820 A1 | 11/2002 | Majumdar et al. |
| 2002/0175408 A1 | 11/2002 | Majumdar et al. |
| 2003/0089899 A1 | 5/2003 | Lieber et al. |
| 2003/0102444 A1 | 6/2003 | Deppert et al. |
| 2003/0121764 A1 | 7/2003 | Yang et al. |
| 2003/0200521 A1 | 10/2003 | DeHon et al. |
| 2004/0175844 A1 | 9/2004 | Yang et al. |
| 2004/0188804 A1* | 9/2004 | Nakayama ............ H01L 23/544 257/620 |
| 2004/0213307 A1 | 10/2004 | Lieber et al. |
| 2004/0252737 A1 | 12/2004 | Yi et al. |
| 2004/0262636 A1 | 12/2004 | Yang et al. |
| 2005/0006673 A1 | 1/2005 | Samuelson et al. |
| 2005/0011431 A1 | 1/2005 | Samuelson et al. |
| 2005/0017171 A1 | 1/2005 | Samuelson et al. |
| 2005/0082543 A1 | 4/2005 | Alizadeh et al. |
| 2005/0145865 A1 | 7/2005 | Okuyama |
| 2005/0161662 A1 | 7/2005 | Majumdar et al. |
| 2005/0184951 A1 | 8/2005 | Kim et al. |
| 2005/0199886 A1 | 9/2005 | Yi et al. |
| 2006/0019470 A1 | 1/2006 | Seifert et al. |
| 2006/0057360 A1 | 3/2006 | Samuelson |
| 2006/0073680 A1 | 4/2006 | Han et al. |
| 2006/0112466 A1 | 5/2006 | Den |
| 2006/0125056 A1 | 6/2006 | Samuelson et al. |
| 2006/0189018 A1 | 8/2006 | Yi et al. |
| 2006/0223211 A1 | 10/2006 | Mishra et al. |
| 2007/0001220 A1 | 1/2007 | Tombler, Jr. et al. |
| 2007/0172183 A1 | 7/2007 | Wang |
| 2007/0206488 A1 | 9/2007 | Thelander et al. |
| 2007/0257264 A1 | 11/2007 | Hersee et al. |
| 2007/0284592 A1 | 12/2007 | Haase |
| 2007/0286945 A1 | 12/2007 | Lahnor et al. |
| 2008/0036038 A1 | 2/2008 | Hersee et al. |
| 2008/0149946 A1 | 6/2008 | Kim et al. |
| 2010/0025673 A1 | 2/2010 | Hu et al. |
| 2010/0283064 A1 | 11/2010 | Samuelson et al. |

FOREIGN PATENT DOCUMENTS

| | | |
|---|---|---|
| EP | 0838865 | 4/1998 |
| EP | 0544408 B1 | 1/2000 |
| EP | 1221722 A1 | 7/2002 |
| EP | 1314189 | 5/2003 |
| EP | 1342075 | 9/2003 |
| EP | 1727216 A2 | 11/2006 |
| JP | 2000-068493 | 3/2000 |
| JP | 2002084037 A | 3/2002 |
| KR | 10-2005-00985420 | 10/2005 |
| KR | 10-2005-0106356 | 11/2005 |
| KR | 10-2006-0121413 | 11/2006 |
| WO | WO1995/02709 | 1/1995 |
| WO | WO1997/31139 | 8/1997 |
| WO | WO2001/03208 | 1/2001 |
| WO | WO2001/77726 | 10/2001 |
| WO | WO2001/84238 | 11/2001 |
| WO | WO2002/01648 | 1/2002 |
| WO | WO2002/17362 A2 | 2/2002 |
| WO | WO2002/48701 A2 | 6/2002 |
| WO | WO2002/080280 | 10/2002 |
| WO | WO2002/095883 A2 | 11/2002 |
| WO | WO2003/005450 | 1/2003 |
| WO | WO2003/053851 | 7/2003 |
| WO | WO2003/063208 | 7/2003 |
| WO | WO2004/004927 A2 | 1/2004 |
| WO | WO2004/010552 | 1/2004 |
| WO | WO2004/038767 | 5/2004 |
| WO | WO2004/084318 | 9/2004 |
| WO | WO2006/034568 A1 | 12/2006 |
| WO | WO2006/135336 A1 | 12/2006 |

OTHER PUBLICATIONS

Abramson et al., "Nanowire Composite Thermoelectric Devices", *Proceedings of IMECE2002, ASME International Mechanical Engineering Congress & Exposition*, Nov. 17-22, 2002, pp. 7-11.

Akabori et al., "Selective Area MOVPE Growth of Two-Dimensional Photonic Crystals Having an Air-Hole Array and its Application to Air-Bridge-Type Structures", *Physica E*, No. 13, 2002, pp. 446-450.

(56) References Cited

OTHER PUBLICATIONS

Akabori, M., et al., "InGaAs Nano-Pillar Array Formation on Partially Masked InP(111)B by Selective Area Metal-Organic Vapour Phase Egitaxial Growth for Two-Dimensional Photonic Crystal Application", *Nanotechnology*, No. 14, Aug. 27, 2003, pp. 1071-1074.

Akabori, M., et al., "Selective Area MOVPE Growth of Two-Dimensional Photonic Crystals Having an Air-Hole Array and its Application to Air-Bridge-Type structure", *Physica E*, No. 13, Jan. 1, 2002, pp. 446-450.

Alferov, Z., et al., "For developing semiconductor heterostructures used in high-speed-and optoelectronics", Nov. 23, 2000, www.nobel.se.physics/laureates/2000/.

Awschalom, D.D. et al., "Spintronics", *Scientific American*, Jun. 1, 2002, pp. 66-73, vol. 286, No. 6.

Bachtold, A., et al., "Logic circuits with carbon nanotube transistors", *Science*, Nov. 9, 2001, pp. 1317-1320, vol. 294.

Bachtold, A., et al., "Scanned probe microscopy of electronic transport in carbon nanotubes" *Phys. Rev. Lett.*, Jun. 26, 2000, pp. 6082-6085, vol. 84, No. 26.

Barrelet et al., "Synthesis of CdS and ZnS Nanowires Using Single-Source Molecular Precursors", *J. Am. Chem. Soc.*, vol. 125, 2003, pp. 11498-11499.

Bennett, C., et al., "Quantum information and computation", *Nature*, Mar. 16, 2000, pp. 247-255, vol. 404.

Bertness et al., "Catalyst-Free Growth of GaN Nanowires," Journal of Electronic Materials, 2006, 35(4):576-580.

Bhat, R., et al., "Patterned Quantum Well Heterostructures Grown by OMCVD on Non-Planar Substrates: Applications to Extremely Narrow SQW Lasers", *Journal of Crystal Growth*, Jan. 1, 1988, pp. 850-856, vol. 93.

Bindal et al., "The impact of silicon nano-wire technology on the design of single-work-function CMOS transistors and circuits," Nanotechnology, 2006, 17:4340-4351.

Björk et al., "Few-Electron Quantum Dots in Nanowires", *Nano Letters*, vol. 4, No. 9, Jul. 28, 2004, pp. 1621-1625.

Björk et al., "Heterostructures in One-Dimensional Nanowires", *Proceedings of 7th International Conference of Nanometer-Scale Science and Technology and 21st European Conference on Surface Science*, Jun. 24, 2002.

Bjork, M., "Semiconductor Nanowires and Devices", *Tekn lic thesis, Lund University*, Nov. 1, 2002.

Bjork, M.T., "Nanowire resonant tunelling diodes", *Applied Physics Letters*, Dec. 2, 2002, pp. 4458-4460, vol. 81, No. 23.

Bjork, M.T., et al., :One-dimensional heterostructures in semiconductor nanowhiskers, *Applied Physics Letters*, Feb. 11, 2002, pp. 1058-1060, vol. 80, No. 6.

Bjork, M.T., et al., "One-dimensional Steeplechase for Electrons Realized", *Nano Letters*, Jan. 19, 2002, pp. 87-89, vol. 2, No. 2.

Borgstrom et al., "Size- and Shape-Controlled GaAs Nano-Whiskers Grown by MOVPE: A Growth Study", *Journal of Crystal Growth*, vol. 260, 2004, pp. 18-22.

Borgstrom, M., et al., "High peak-to-valley ratios observed in InAs/InP resonant tunneling quantum dot stacks", *Applied Physics Letters*, May 21, 2001, pp. 3232-3234, vol. 78, No. 21.

Bozovic et al., "Plastic Deformation in Mechanically Strained Single-Walled Carbon Nanotubes", *Physical Review B*, vol. 57, Jan. 22, 2003, pp. 033407-1-033407-4.

Bryllert et al., "Vertical wrap-gated nanowire transistors," *Nanotechnology*, 2006, 17:S227-S230.

Canham, L.T., "Silicon Quantum Wire Array Fabrication by Electrochemical and Chemical Dissolution of Wafers", *Applied Physics Letters*, Sep. 3, 1990, pp. 1046-1048, vol. 57.

Capasso, F., et al., "Quantum Cascade Lasers", *Physics Today*, May 1, 2002, pp. 34-40.

Choi et al., "Self-Organized GaN Quantum Wire UV Lasers", *J. Phys. Chem. B.*, vol. 107, 2003, pp. 8721-8725.

Chow, E., et al., "Three-dimensional control of light in a two-dimensional photonic crystal slab", *Nature*, Oct. 26, 2000, pp. 983-986, vol. 407.

Cui, Y., et al., "Diameter-controlled synthesis of single-crystal silicon nanowires", *Applied Physics Letters*, Apr. 9, 2001, pp. 2214-2216, vol. 78, No. 15.

Cui, Y., et al., "Doping and Electrical Transport in Silicon Nanowires" *The Journal of Physical Chemistry B*, May 11, 2000, pp. 5213-5216, vol. 104, No. 22.

Cui, Y., et al., "Functional Nanoscale Electronic Devices Assembled Using Silicon Nanowire Building Blocks", *Science*, Feb. 2, 2001, pp. 851-853, vol. 291.

Cui, Y., et al., "High Performance Silicon Nanowire Field Effect Transistors", *Nano Letters*, Jan. 1, 2003, pp. 149-152, vol. 3, No. 2.

Cui, Y., et al., "Nanowire nanosensors for highly sensitive and selective detection of biological and chemical species", *Science*, Aug. 17, 2001, pp. 1289-1292, vol. 293.

Dai, H., et al., "Synthesis and Characterization of Carbide Nanorods", *Nature*, Jun. 29, 1995, pp. 769-772, vol. 375.

Dailey et al., "Vapor-liquid-solid growth of germanium nanostructures on silicon," *Journal of Applied Physics*, Dec. 15, 2004, 96(12):7556-7567.

Derycke, V., et al., "Carbon Nonotube Inter- and Intramolecular Logic Gates", *Nano Letters*, Aug. 26, 2001, pp. 453-456, vol. 1, No. 9.

Dick et al., "Synthesis of Branched 'Nanotrees' by Controlling Seeding of Multiple Branching Events", *Nature Materials*, vol. 3, May 2, 2004.

Duan, X. et al., "General Synthesis of Compound Semiconductor Nanowires", *Advanced Materials*, Jan. 1, 2000, pp. 298-302, vol. 12, No. 4.

Duan, X. et al., "Laser Assisted Catalytic Growth of Semiconductor Nanowires for Nanoscale Electronic Optoelectronic Device Application", *Abstracts of Papers of- the Amer. Chem. Soc.*, Apr. 1, 2001, pp. 644-Inor Part 1, vol. 221.

Duan, X. et al., "Laser Assisted Catalytic Growth of Single-Crystal Compound Semiconductor Nanowires", *Abstracts of Papers of- the Amer. Chem. Soc.*, Mar. 26, 2000, pp. 676-Inor Part 1, vol. 219.

Duan, X., "Single-nanowire electrically driven lasers", *Nature*, Jan. 16, 2003, pp. 241-244, vol. 421.

Duan, X., et al., "Indium phosphide nanowires as building blocks for nanoscale electronic and optoelectronic devices", *Nature*, Jan. 4, 2001, pp. 66-69, vol. 409.

Duan, X., et al., "Laser-Assisted Catalytic Growth of Single Crystal GaN Nanowires" *Journal of Amer. Chem. Soc.*, Dec. 18, 1999, pp. 188-189, vol. 122, No. 1.

Duan, X., et al., "Nonvolatile Memory and Programmable Logic from Molecule-Gated Nanowires", *Nano Letters*, May 1, 2002, pp. 487-490, vol. 2, No. 5.

Duan, X., et al., "Synthesis and optical properties of gallium arsenide nanowires" *Applied Physics Letters*, Feb. 28, 2000, pp. 1116-1118, vol. 76, No. 9.

Favier, F., et al., "Hydrogen Sensors and Switches from Electrodeposited Palladium Mesowire Arrays", *Science*, Sep. 21, 2001, pp. 2227-2231, vol. 293.

Ferry, D.K., et al., "Transport in Nanostructures", *Cambridge University Press*, Hardcover, Jan. 1, 1997, pp. 41-45 and 91-96.

Gao, et al., "Self-Assembled Nanowire-Nanoribbon Junction Arrays of ZnO", *The Journal of Physical Chemistry*, Nov. 12, 2002, pp. 12653-12658, vol. 106, No. 49.

Gates, B., et al., "Single-Crystalline Nanowires of Ag2Se Can Be Synthesized by Templating Against Nanowires of Trigonal Se", *Journal of the Amer. Chem. Soc.*, Oct. 25, 2001, pp. 11500-11501, vol. 123, No. 46.

Gates, B., et al., "Synthesis and Characterization of Crystalline Ag2Se Nanowires through a Template-Engaged Reaction at Room Temperature", *Advanced Fun. Materials*, Oct. 1, 2002, pp. 679-686, vol. 12, No. 10.

Givargizov, E., "Growth of Whiskers by the Vapor-Liquid-Solid Mechanism" *Current Tonics in Material Science*, edited by E. Kaldis, Jan. 1, 1978, pp. 79-145, Chapter 3, vol. 1.

Givargizov, E.I., "Fundamental Aspects of VLS Growth", *Journal of Crystal Growth*, Jan. 1, 1975, pp. 20-30, vol. 31.

Gorbach et al., "Growth of III-V Semiconductor Layers on Si Patterned Substrates", *Thin Solid Films*, vol. 336, 1998, pp. 63-68.

(56) References Cited

OTHER PUBLICATIONS

Grätzel, "Photoelectrochemical Cells", *Nature*, vol. 414, Nov. 15, 2001, pp. 338-344.
Greene et al., "Low-Temperature Wafer-Scale Production of ZnO Nanowire Arrays", *Angew. Chem. Int. Ed.*, vol. 42, 2003, pp. 3031-3034.
Greytak et al., "Growth and Transport Properties of Complementary Germanium Nanowire Field-Effect Transistors", *Applied Physics Letters*, vol. 84, No. 21, May 24, 2004, pp. 4176-4178.
Gudiksen, M.S., et al., "Diameter-selective synthesis of semiconductor nanowires", *J. Am. Chem. Soc.*, Aug. 22, 2000, pp. 8801-8802, vol. 122.
Gudiksen, M.S., et al., "Growth of nanawire superlattice structures for nanoscale photonics and electronics", *Nature*, Feb. 7, 2002, pp. 617-620, vol. 415.
Gudiksen, M.S., et al., "Size-Dependent Photoluminescence from Single Indium Phosphide Nanowires", *Journal of Physical Chemistry B*, Mar. 30, 2002, pp. 4036-4039, vol. 106, No. 16.
Gudiksen, M.S., et al., "Synthetic Control of the Diameter and Length of Single Crystal Semiconductor Nanowires", *The Journal of Physical Chemistry B*, Apr. 18, 2001, pp. 4062-4064, vol. 105.
Hahm et al., "Direct Ultrasensitive Electrical Detection of DNA and DNA Sequence Variations Using Nanowire Nanosensors", *Nano Letters*, vol. 4, No. 1, Dec. 9, 2003, pp. 51-54.
Han, W., et al., "Synthesis of Gallium Nitride Nanorods Throuah a Carbon Nanotube-Confined Reaction", *Science*, Aug. 29, 1997, pp. 1287-1289, vol. 277.
Hara, S., et al, "Formation and Photoldnescence Characterization of Quantum Well Wires Using Multiatdc Steps Grown by Metalorganic Vapor Phase Epitaxy", *Journal of Crystal Growth*, Jan. 1, 1994, pp. 692-697, vol. 145.
Haraguchi, K. et al., "GaAs p-n junction formed in quantum wire crystals", *Applied Physics Letters*, Feb. 10, 1992, pp. 745-747, vol. 60, No. 6.
Haraguchi, K., et al., "Polarization dependence of light emitted from GaAs p-n junctions in quantum wire crystals", *Journal of Applied Physics*, Apr. 15, 1994, pp. 4220-4225, vol. 75.
Hayakawa, K., et al., "AlGaAs Nano-Meter Scale Network Structures Fabricated by Selective Area MOVPE", *Phys. Conf. Ser.*, No. 162, Chapter 8, Oct. 12-16, 1998.
Henning, P., et al., "Compositional information from amorphous Si—Ge multilayers using high-resolution electron microscopy imaging and direct digital recording", Ultramicroscopy, Jan. 1, 1996, pp. 221-235, vol. 66.
Hersee et al., "The Controlled Growth of GaN Nanowires," Nano Letters, 2006, 6(8):1808-1811.
Hickmott, T.W., et al., "Negative Charge, Barrier Heights, and the Conduction-Ban Discontinuity in $Al_xGa_{1-x}As$ Capacitors",*Journal of Applied Physics*, Apr. 15, 1985, pp. 2844-2853, vol. 57.
Hicks, L.D., et al., "Thermoelectric Figure of Merit of a One-Dimensional Conductor", *Physical Review B*, Jun. 15, 1993, pp. 16631-16634, vol. 47, No. 24.
Hiruma et al., "Quantum Size Microcrystals Grown Using Organametallic Vapor Phase Epitaxy" *Appl. Phys. Lett.*, vol. 59, No. 4, Jul. 22, 1991, pp. 431-433.
Hiruma, K., et al., "GaAs free-standing quantum-size wires", *Journal of Applied Physics*, Sep. 1, 1993, pp. 3162-3171, vol. 74.
Hiruma, K., et al., "Gas and InAs Nanowire Growth Technology", *Proceedings of the Science and Technology of Atomically Engineered Materials*, Oct. 30, 1995, pp. 563-570.
Hiruma, K., et al., "Gas free-standing quantum-size wires", *Journal of Applied Physics*, Sep. 1, 1993, pp. 3162-3171, vol. 74.
Hiruma, K., et al., "Growth and Characterization of Nanometer-Scale GaAs, AiGaAs and GaAs/InAs Wires", *IEICE Trans. Electron.*, Sep. 1, 1994, pp. 1420-1425, vol. E77-C, No. 9.
Hiruma, K., et al., "Growth and optical properties of nanometerscale GaAs and InAs whiskers", *Applied Physics Review*, Jan. 15, 1995, pp. 447-462, vol. 77.
Hiruma, K., et al., Self-organized growth of GaAs/InAs heterostructure nanocylinders by organometallic vapor phase epitaxy, *Journal of Crystal Growth*, Jan. 1, 1996, pp. 226-231, vol. 163.
Holmes, J., et al., "Control of Thickness and Orientation of Solution-Grown Silicon Nanowires", *Science*, Feb. 25, 2000, pp. 1471-1473, vol. 287.
Hornstra, "Dislocations in the Diamond Lattice", *J. Phys. Checm. Solids*, vol. 5, 1958, pp. 129-141.
Hu, J. et al., "Chemistry and Physics in One Dimension: Synthesis and Properties of Nanowires and Nanotubes", *Acc. Chem. Res.*, Feb. 20, 1999, pp. 435-445, vol. 32, No. 5.
Hu, J., et al., "Controlled Growth and Electrical Properties of Heterojunctions of Carbon Nanotubes and Silicon Nanowires", *Nature*, May 6, 1999, pp. 48-51, vol. 399.
Huang, et al., "Directed Assembly of one-dimensional nanostructures into functional networks", *Science*, Jan. 26, 2001, pp. 630-633, vol. 291.
Huang, M., et al., "Catalytic Growth of Zinc Oxide Nanowires by Vapor Transport", *Advanced Materials*, Jan. 16, 2001, pp. 113-116, vol. 13, No. 2.
Huang, M., et al., "Nanowire Array as Potential 2-d Photonic Bandgap Materials", *Abstracts of Paners in the Amer. Chem. Soc.*, Apr. 1, 2001, pp. 95—Phys Part 2, vol. 221.
Huang, M.H., et al., "Room-Temperature Ultraviolet Nanowire Nanolasers", *Science*, Jun. 8, 2001, pp. 1897-1899.
Huang, Y., et al., "Gallium Nitride Nanowire Nanodevices", *Nano Letters*, Jan. 11, 2002, pp. 81-82, vol. 2, No. 2.
HUANG, Y., et al., "Integrated Optoelectronics Assembled from Semiconductor Nanowires", *Abstracts of Pagers of- the Amer. Chem. Soc.*, Aug. 18, 2002, pp. 039—Phys Part 2, Vol. 224.
HUANG, Y., et al., "Logic Gates and Computation from Assembled Nanowire Building Blocks", *Science*, Nov. 9, 2001, pp. 1313-1317, Vol. 294.
Iijima, S., "Helical microtubules of graphitic carbon", *Nature*, Nov. 7, 1991, pp. 56-58, vol. 354.
International Search Report and Written Opinion dated Apr. 25, 2008, in PCT/SE2008/050036, 12 pages.
Itskevich, I.E., et al., "Resonant magnetotunneling through individual self-assembled InAs quantum dots", *Physical Review B*, Dec. 15, 1996, pp. 16401-16404, vol. 54, No. 23.
Jensen et al., "Role of Surface Diffusion in Chemical Beam Epitaxy of InAs Nanowires", *Nano Letters*, vol. 4, No. 10, Sep. 14, 2004, pp. 1961-1964.
Johnson et al., "Single Nanowire Waveguides and Lasers", *Proceedings of SPIE*, vol. 5223, 2003, pp. 187-196.
Johnson, J., et al., "Near-Field Imaging of Nonlinear Optical Mixing in Single Zinc Oxide Nanowires", *Nano Letters*, Apr. 1, 2002, pp. 279-283, vol. 2, No. 4.
Johnson, J., et al., "Single Gallium Nitride Nanowire Lasers", *Nature Materials*, Sep. 15, 2002, pp. 106-110, vol. 1, No. 2.
Johnson, J., et al., "Single Nanowire Lasers", *Journal of Physical Chemistry B*, Oct. 23, 2001, pp. 11387-11390, vol. 105, No. 46.
Jun, et al., "Architectural Control of Magnetic Semiconductor Nanocrystals", *J. Am. Checm Soc.*, Jan. 4, 2002, pp. 615-619, vol. 124, No. 4.
Jun, et al., "Controlled Synthesis of Multi-Armed CdS Nanorod Architectures Using Monosurfactant System", *J. Am. Chem. Soc.*, May 5, 2001, pp. 5150-5151, vol. 123.
Junno, T., et al., "Controlled manipulation of nanogarticles with an atomic force microscope" *Applied Physics Letters*, Jun. 26, 1995, pp. 3627-3629, vol. 66.
Kamins et al., "Growth and Structure of Chemically Vapor Deposited Ge Nanowires on Si Substrates", *Nano Letters*, vol. 4, No. 3, Jan. 23, 2004, pp. 503-506.
Kamins et al., "Ti-Catalyzed Si Nanowjres by Chemical Vapor Deposition: Microscopy and Growth Mechanisms", *Journal of Applied Physics*, vol. 89, No. 2, Jan. 15, 2001, pp. 1008-1016.
Kamins, T.I., et al., "Self-Assembled Silicon Nanowires for Integrating Microsystems, Nanoelectronics and Microelectronics", *mstnews*, Mar. 2003, Mar. 1, 2003.
Kapon, E., et al., "Stimulated Emission in Semiconductor Quantum Wire Heterostructures", *Physical Review Letters*, Jul. 24, 1989, pp. 430-433, vol. 63, No. 4.

(56) References Cited

OTHER PUBLICATIONS

Kawanami, "Heteroepitaxial Technologies of III-V on Si", *Solar Energy Materials & Solar Cells*, vol. 66, 2001, pp. 479-486.

Kempa, K., et al., "Photonic Crystals Based on Periodic Arrays of Aligned Carbon Nanotubes", *Nano Letters*, Nov. 19, 2002, pp. 13-18, vol. 3, No. 1.

Kim et al., "Nanowire Arrays for Thermoelectric Devices" *Proceedings of HT2003, ASME Summer Heat Transfer Conference*, Jul. 21-23, 2003, pp. 101-104.

Kind, H., et al., "Nanowire Ultraviolet Photodetectors and Optical Switches", *Advanced Materials*, Jan. 16, 2002, pp. 158-160, vol. 14, No. 2.

Kipshidze et al., "Controlled growth of GaN nanowires by pulsed metalorganic chemical vapor deposition," *Applied Physics Letters*, 2005, 86:033104-1 to 033104-3.

Knutson, E., et al., "Aerosol Classification by Electric Mobility: Apparatus, Theory, and Applications", *Journal of Aerosol Science*, Jan. 1, 1975, pp. 443-451, vol. 6.

Koga, T., et al., "Carrier Pocket Engineering Applied to Strained . . . ", *Applied Physics Letters*, Oct. 18, 1999, pp. 2438-2440, vol. 75.

Koga, T., et al., "Experimental Proof-of-Principle Investigation of Enhanced $Z_{3d}T$ in (001) Oriented Si/Ge Superlattices", *Applied Physics Letters*, Sep. 4, 2000, pp. 1490-1492, vol. 77, No. 10.

Kovtyukhova, N., et al., "Layer-by-Layer Assembly Rectifying Junctions in and on Metal Nanowires", *Journal of Physical Chemistry B*, Aug. 14, 2001, pp. 8762-8769, vol. 105.

Krost et al., "InP on Si(111): Accommodation of Lattice Mismatch and Structural Properties", *Appl. Phys. Lett.*, vol. 64, No. 7, Feb. 7, 1994, pp. 769-771.

Kuykendall et al., "Crystallographic Alignment of High-Density Gallium Nitride Nanowire Arrays", *Nature Materials*, vol. 3, Jul. 25, 2004, pp. 524-528.

Lao et al., "Hierarchical ZnO Nanostructures", *Nano Letters*, vol. 2, Sep. 13, 2002, pp. 1287-1291.

Larsson et al, In-Situ Manipulations and Electrical Measurements of III-V Nanowhiskers with TEM-STM, Proceedings of $7^{th}$ International Conference of Nanometer-Scale Science and Technology and $21^{st}$ European Conference on Surface Science, Jun. 24, 2002.

Larsson et al., "Probing of Individual Semiconductor Nanowhiskers by TEM-STM", *Microscopy and Microanalysis*, vol. 10, 2004, pp. 41-46.

Laughlin, R.B., et al., "For their discovery of a new form of quantum fluid with frictionally charged excitations", Jun. 16, 2000, www.nobel.se/physics/laureates/1998/.

Lauhon, L., et al., "Epitaxial Core-Shell and Core-Multishell Nanowire Heterostructures", *Nature*, Nov. 7, 2002, pp. 57-61, vol. 420, No. 6911.

Law et al., "Photochemical Sensing of $NO_2$ with $SnO_2$ Nanoribbon Nanosensors at Room Temperature", *Angew. Chem. Int. Ed.*, vol. 41, No. 13, 2002, pp. 2405-2408.

Li, Y., et al, "Bismuth Nanotubes: A Rational Low-Temperature Synthetic Route", Journal of the Amer. Chem. Soc., Sep. 14, 2001, pp. 9904-9905, vol. 123, No. 40.

Lieber et al., "Nanowires as Building Blocks for Nanoelectronics and Nanophotonics", *Electron Devices Meeting 2003 IEEE International*, 2003, pp. 12.3.1-12.3.3.

Lieber, "Nanoscale Science and Technology: Building a Big Future from Small Things", MRS Bulletin, Jul. 2003, pp. 486-491.

Lieber, C., "Nanowire Superlattices", *Nano Letters*, Jan. 25, 2002, pp. 82-82, vol. 2, No. 2.

Lieber, C., "Nanowires as Building Blocks for Nanoscale Science and Technology", *Abstracts of Papers of the Amer. Chem Soc.*, Aug. 18, 2002, pp. 033—Camp Part 1, vol. 224.

Lieber, C., "Semiconductor Nanowires: Building Blocks for Nanoscale Science and Technology", *Abstracts of Papers of- the Amer. Chem. Soc.*, Aug. 1, 2001, pp. 383—Phys Part 2, vol. 222.

Lieber, C., "The incredible shrinking circuit", *Sci. Am.*, Sep. 1, 2001, pp. 58-64, vol. 285.

Likharev, K.K., "Single-Electron Devices and their Applications", *Proceedings of the IEEE*, Apr. 1, 1999, pp. 606-632, vol. 87, No. 4.

Liu J.L., et al., "Gas-source MBE growth of freestanding Si nanowires on Au/S1 substrate", *Superlattices Microstructures*, 1999, pp. 477-479, vol. 25, No. 1-2.

Ma et al., "Small-Diameter Silicon Nanowire Surfaces," Science, Mar. 21, 2003, 299:1874-1877.

Magnusson, M., et al., "Gold nano articles: Production, reshaping, and thermal charging", *Journal of Nanoparticle Research*, Jan. 1, 1999, pp. 243-251, vol. 1.

Manna et al., "Controlled Growth of Tetrapod-Branched Inorganic Nanocrystals", *Nature Materials*, vol. 2, Jun. 2003, pp. 382-385.

Manna, et al., "Synthesis of Soluble and Processable Rod-, Arrow-, Teardrop-, and Tetrapod-Shaped CdSe Nanocrystals", *J. Am. Chec. Soc.*, Dec. 1, 2000, pp. 12700-12706, vol. 122, No. 51.

Markowitz, P.D., et al., "Phase Separation in $Al_xGa_{1-x}As$ Nanowhiskers Grown by the Solution-Liquid-Solid Mechanism", *J. Am. Chem. Soc.*, Apr. 18, 2001, pp. 4502-4511, vol. 123.

Martensson et al., "Epitaxial-III-V Nanowires on Silicon", *Nano Letters*, vol. 4, No. 10, Sep. 23, 2004, pp. 1987-1990.

Martensson et al., "Nanowire Arrays Defined by Nanoimprint Lithography", *Nano Letters*, vol. 4, Mar. 17, 2004, pp. 699-702.

Martensson, T., et al., "Fabrication of Individually Seeded Nanowire Arrays by Vapour-Liquid-Solid Growth", *Nanotechnology*, Oct. 17, 2003, pp. 1255-1258, No. 14.

Matthews, J., et al., "Defects in Epitaxial Multillayers", *Journal of Crystal Growth*, Jan. 1, 1974, pp. 118-125, vol. 27.

McAlpine et al., "High-Performance Nanowire Electronics and Photonics on Glass and Plastic Substrates", *Nano Letters*, vol. 3, No. 11, Oct. 14, 2003, pp. 1531-1535.

McAlpine et al., "Nanoimprint Lithography for Hybrid Plastic Electronics", *Nano Letters*, vol. 3, No. 4, Mar. 7, 2003, pp. 443-445.

Melechko et al., "Large-Scale Synthesis of Arrays of High-Aspect-Ratio Ridig Vertically Aligned Carbon Nanofibres", *Nanotechnology*, No. 14, Aug. 19, 2003, pp. 1029-1035.

Melechko, A.V., et al., "Large-Scale Synthesis of Arrays of High-Aspect-Ratio Rigid Vertically Aligned Carbon Nanofibres", *Nanotechnology*, No. 14, Aug. 19, 2003, pp. 1029-1035.

Messer, B., et al., "Microchannel Networks for Nanowire Patterning", *Journal of the Amer. Chem. Soc.*, Sep. 29, 2000, pp. 10232-10233, vol. 122, No. 41.

Michler, P. et al., "Quantum correlation among photons from a single quantum dot at room temperature", *Nature*, Aug. 31, 2000, pp. 968-970, vol. 406, No. 6799.

Mikkelsen et al., "Direct Imaging of the Atomic Structure Inside a Nanowire by Scanning Tunneling Microscopy", *Nature Materials*, vol. 3, Jul. 4, 2004, pp. 519-523.

Miller, M., et al., "Serpentine Superlattice: Concept and First Results", *Journal of Crystal Growth*, Jan. 1, 1991, pp. 323-327, vol. 111.

Mohan et al., "Controlled growth of highly uniform, axial/radial direction-defined, individually addressable InP nanowire arrays," Nanotechnology, 2005, 16:2903-2907.

Mohan et al., "Realization of conductive InAs nanotubes based on lattice-mismatched InP/InAs core-shell nanowires," Applied Physics Letters, 2006, 88:013110-1 to 013110-3.

Morales, A., et al., "A Laser Ablation Method for the Synthesis of Crystalline Semiconductor Nanowires", *Science*, Jan. 9, 1998, pp. 208-211, vol. 279.

Morales, A., et al., "Rational Synthesis of Silicon Nanowires", *INOR*, 651, Jan. 1, 2001.

Mullins, J., "News analysis: using unusable frequencies", *IEEE Spectrum*, Jul. 1, 2002, pp. 22-23, vol. 39, No. 7.

Murphy, C.J., et al., "Controlling the Aspect Ratio of Inorganic Nanorods and Nanowires",*Advanced Materials*, Jan. 4, 2002, pp. 80-82, vol. 14, No. 1.

Narihiro, M., et al., "Resonant tunneling of electrons via 20 nm scale InAs quantum dot and magnetotunneling spectroscopy of its electronic states", *Applied Physics Letters*, Jan. 6, 1997, pp. 105-107, vol. 70, No. 1.

Ng et al., "Epitaxial Single Crystalline Inorganic Nanowires and Nanowalls: Growth Morphogenesis and Applications in Nano-Optoelectronics", *Proceedings of SPIE*, vol. 5349, 2004, pp. 11-17.

Ng et al., "Growth of Epitaxial Nanowires at the Junctions of Nanowalls", *Science*, vol. 300, May 23, 2003, p. 12.

(56) References Cited

OTHER PUBLICATIONS

Ng et al., "Single Crystal Nanowire Vertical Surround-Gate-Field-Effect Transistor", *Nano Letters*, vol. 4, No. 7, May 29, 2004, pp. 1247-1252.

Ng et al., "Three Dimensional Columnar Optical Nanostructures Fabricated by Using Lithography-Free Templating Approach", *Applied Physics Letters*, vol. 84, No. 15, Apr. 12, 2004, pp. 2898-2900.

Nicewarner-Pena, S.R., et al., "Submicrometer metallic barcodes", *Science*, Oct. 5, 2001, pp. 137-141, vol. 294.

O'Regan, et al., "A Low-Cost, High-Efficiency Solar Cell Based on Dye-Sensitized Colloidal TiOa Films", *Nature*, Oct. 24, 1991, pp. 737-740, vol. 353.

Oda et al., "Natural Formation of Square Scale Structures on Patterned Vicinal Substrates by MOVPE: Application to the Fabrication of Quantum Structures", *Inst. Phys. Conf. Ser.*, No. 166, Chapter 4, Aug. 22, 1999, pp. 191-194.

Oda, Y., et al., "Natural Formation of Square Scale Structures on Patterned Vicinal Substrates by MOVPE: Application to the Fabrication of Quantum Structures", *Phys. Conf. Ser.*, No. 166, Chapter 4, Aug. 22-26, 1999, pp. 191-194.

Ohlsson et al., "Anti-Domain-Free GaP, Grown in Atomically Flat (001) Si Sub-µm-sized Openings", *Applied Physics Letters*, vol. 80, No. 24, Jun. 17, 2002, pp. 4546-4548.

Ohlsson et al., "Comparison Between (111)B and (100)III-V Nanowhiskers", Proceedings of $7^{th}$ International Conference of Nanometer-Scale Science and Technology and 21st European Conference on Surface Science, Jun. 24, 2002.

Ohlsson, B., et al., "Anisotropic GaAs island phase grown on flat Gap: A stranski-Krastanow-formed corrugated surface", *Journal of Applied Physics*, May 15, 2001, pp. 5726-5730, vol. 89, No. 10.

Ohlsson, B., et al., "Fabrication and characterization of III-V nanowhiskers" *MSS10 Conference—Austria*, Jul. 23-27, 2001.

Ohlsson, B.J., et al., "Growth and characterization of GaAs and InAs nano-whiskers and InAs/GaAs heterostructures", *Physica E*, Mar. 1, 2002, pp. 1126-1130, No. 13.

Ohlsson, B.J., et al., "Size-, shape-, and position-controlled GaAs nono-whiskers" *Applied Physics Letters*, Nov. 12, 2001, pp. 3335-3337, vol. 79, No. 20.

Ohlsson, J., "Semiconductor Hetero- and Nanostructures", *Doctoral Thesis, Lund Institute of Technology, Lund University*, Nov. 23, 2001.

Ozaki et al., "Silicon Nanowhiskers Grown on a Hydrogen-Terminated Silicon (111) Surface", *Applied Physics Letters*, vol. 73, No. 25, Dec. 21, 1998, pp. 3700-3702.

Pan et al., "Single-crystal growth of metallic nanowires with preferred orientation," *Nanotechnology*, 2005, 16:1559-1564.

Pan, Z., et al., "Conduction band offset and electron effective mass in GaInNAs/GaAs quantum-well structures with low nitrogen concentration", *Applied Physics Letters*, Apr. 9, 2001, pp. 2217-2219, vol. 78, No. 15.

Panev, N., et al., "Sharp Exciton Emission From Single InAs Quantum Dots in GaAs Nanowires", *Applied Physics Letters*, Sep. 15, 2003, pp. 2238-2240, vol. 83, No. 11.

Persson et al., "Solid-phase-diffusion mechanism for GaAs nanowire growth", *Nature Materials*, vol. 3, Oct. 2004, pp. 677-681.

Persson, "Heterointerfaces in III-V semiconductor nanowhiskers", *IEEE*, 2002, pp. 281-283.

Persson, A., "Oriented Growth of InAs-based Nanowhiskers" *Diploma Work, Lund Institute of Technology, Lund University*, May 29, 2001, pp. 1-48.

Persson, M., "Tight-Binding Simulation of Nanocrystalline Particles and Whiskers", *Tekn lic thesis, Lund University*, Aug. 1, 2002.

Persson, M.P. et al., "Electronic Structure of Nanometer-Scale GaAs Whiskers" *Applied Physics Letters*, Aug. 12, 2002, pp. 1309-1311, vol. 81, No. 7.

Pettersson, H., et al., "Electrical and Optical Properties of Self-Assembled InAs Quantum Dots in InP Studied by Space-Charge Spectroscopy and Photoluminescence", *Phys. Rev. B*, Feb. 15, 2000, pp. 4795-4800, vol. 61, No. 7.

Poole, et al., "Spatially Controlled, Nanoparticle-Free Growth of InP Nanowires" *Applied Physics Letters*, Sep. 8, 2002, pp. 2055-2057, vol. 83, No. 10.

Qian et al., "Core/Multishell Nanowire Heterostructures as Multicolor, High-Efficiency Light-Emitting Diodes," *Nano Letters*, 2005, 5(11):2287-2291.

Ramvall et al., Quantized Conductance in a Heterostructurally Defined $Ga_{0.25}In_{0.75}As/InP$, *Appl. Phys. Lett.*, vol. 71, Aug. 18, 1997, pp. 918-920.

Randall, J.N., et al., "Quantum Dot Devices", in Norman G. Einsgruch and William R. Frensley, eds., Heterostructures and Quantum Devices (San Diego, CA: Academic Pres, Inc., 1994) Copyright 1994, p. 420.

Reed, M.A., et al., "Observation of Discrete Electronic States in a Zero-Dimensional Semiconductor Nanostructure", *Physical Review Letters*, Feb. 8, 1988, pp. 535-537, vol. 60, No. 6.

Sakaki, H., "Scattering Suppression and High-Mobility Effect of Size-Quantized Electrons in Ultrafine Semiconductor Wire Structures", *Japanese Journal of Applied Physics*, Dec. 1, 1980, pp. L735-L738, vol. 19, No. 12.

Samuelson et al., "Fabrication and Imaging of Quantum Well Wire Structures", *SPIE*, vol. 1676, 1992, pp. 154-160.

Samuelson et al., "Fabrication and Spectroscopic Studies of InP/GaInAs/Inp and GaAs/GaInAs/GaAs Quantum-Well Wire Structures", *Inst. Phys. Confer. Ser.* No. 127, Chapter 3, Jan. 1, 1992, pp. 95-98.

Samuelson et al., "Semiconductor Nanowires for Novel One-Dimensional Devices", *Physica E*, vol. 21, 2004, pp. 560-567.

Samuelson, L., "Self-Forming Nanoscale Devices", *Materials Today*, Oct. 22, 2003, pp. 22-31.

Samuelson, L., et al., "Tunnel-Induced Photon Emission in Semiconductors Using an STM" *Physica Scripta*, Jan. 1, 1992, pp. 149-152, vol. T42.

Santori, C., et al., "Triggered Single Photons from a Quantum Dot", *Physical Review Letters*, Feb. 19, 2001, pp. 1502-1505, vol. 86, No. 8.

Sato, T., "Site-controlled growth of nanowhiskers", *Applied Physics Letters*, Jan. 9, 1995, pp. 159-161, vol. 66.

Scheibel, H., et al., "Generation of Monodisperse Ag- and NaCl Aerosols With Particle Diameters Between 2 and 300 nm", *Journal of Aerosol Science*, Jan. 1, 1983, pp. 113-126, vol. 14, No. 2.

Schubert et al., "Silicon Nanowhiskers Grown on <111> Si Substrates by Molecular-Bean Epitaxy", *Applied Physics Letters*, vol. 84, No. 24, Jun. 14, 2004, pp. 4968-4970.

Seifert, W. et al, "In-Situ Growth of Quantum Dot Structures by the Stranski-Krastanow Growth Mode", *Prog. Crys. Growth Charact.*, Jan. 1, 1996, pp. 423-471, vol. 33.

Service, R.F., "Nanowire Fabricators Earn Their Stripes", *Science*, Jan. 1, 2002, pp. 946-947, vol. 295, No. 5557.

Shimada, et al., "Size, position and direction control on GaAs and InAs nanowhisker growth", *Superlattices and Microstructures*, Dec. 1998, pp. 453-458, vol. 24, No. 6.

Shirai, M., et al., "Gold cluster formation using an atomic force microscope and its applications to GaAs whisker growth", *Superlattices and Microstructures*, Aug. 1998, pp. 157-162, vol. 24, No. 2.

Shorubalko et al., "Tunable Nonlinear Current-Voltage Characteristics of Three-Terminal Ballistic Nanojunctions", *Applied Physics Letters*, vol. 83, No. 12, Sep. 22, 2003, pp. 2369-2371.

Song, J., et al., "Metal Nanowire Formation Using $Mo_3Se_3$-as Reducing and Sacrificing Templates", Journal of the Amer. Chem. Soc., Sep. 26, 2001, pp. 10397-10398, vol. 123, No. 42.

Song, J., et al., "$MMo_3Se_3$ (M=Li+,Na+, Rb+,Cs+, NMe4+) Nanowire Formation via Cation Exchange in Organic Solution", *Journal of the Amer. Chem. Soc.*, Mar. 10, 2001, pp. 9714-9715, vol. 123, No. 39.

Takahashi, H., et al., "Formation and Characteristics of 100 nm Scale GaAs Quantum Wires by Selective Area MOVPE", *Applied Surface Science*, No. 216, Jan. 1, 2003, pp. 402-406.

Thelander et al., "Electron Transport in InAs Nanowires and Heterostructure Nanowire Devices", *Solid State Communications*, vol. 131, Jun. 11, 2004, pp. 573-579.

Thelander et al., "One Dimensional Heterostructures and Resonant Tunneling in III-V Nanowires" *IEEE International Symposium on Compound Semiconductors*, Aug. 25, 2003, pp. 151-152.

(56) References Cited

OTHER PUBLICATIONS

Thelander, C., "Quantum Devices from the Assembly of Zero-and One-Dimensional Building Blocks", *Doctoral Thesis, Lund University*, Nov. 7, 2003.
Thelander, C., et al., "Single-Electron Transistors in Heterostructure Nanowires", *Applied Physics Letters*, Sep. 8, 2003, pp. 2052-2054, vol. 83, No. 10.
Thelander, et al., "Gold manoparticle single-electron transistor with carbon nanotube leads", *Applied Physics Letters*, Sep. 24, 2001, pp. 2106-2108, vol. 79, No. 13.
Thornton et al., "A Photoemission Study of Passivated Silicon Surfaces Produced by Etching in Solutions of HF", *Semicond. Sci. Technol.*, vol. 4, 1989, pp. 847-851.
Venkatasubramanian, R., et al., "Thin-Film Thermoelectric Devices with High Room-Temperature Figures of Merit", *Nature*, Oct. 11, 2003, pp. 597-602, vol. 413.
Von Klitzing, K., "for the discovery of the quantized Hall effect", Jun. 16, 2000, www.nobel.se/physics/laureates/1985/.
Wagner, R.S., "VLS Mechanism of Crystal Growth", *Whisker Technology, A.P. Levitt, ed.*, Chapter 3, Jan. 1, 1970, pp. 47-119.
Wagner, R.S., et al., "Vapour-Liquid-Solid Mechanism of Single Crystal Growth", *Applied Physics Letters*, Mar. 1, 1964, pp. 89-90, vol. 4, No. 5.
Wang et al., "Nanocrystals Branch Out", *Nature Materials*, vol. 2, Jun. 2003, pp. 385-386.
Wang et al., "Rational Growth of Branched and Hyperbranched Nanowire Structures", *Nano Letters*, vol. 4, No. 5, Mar. 31, 2004.
Wang, J., et al., "Highly Polarized Photoluminesence and Photodetection from Single Indium Phosphide Nanowires", *Science*, Aug. 24, 2001, pp. 1455-1457, vol. 293, No. 5534.
Westwater et al., "Growth of Silicon Nanowires Via Gold/Silane Vapor-Liquid-Solid Reaction" *J. Vac. Sci. Technol. B.*, vol. 15, No. 3, 1997, pp. 554-557.
Westwater et al., "Nanoscale Silicon Whiskers Formed by Silane/Gold Reaction at 335° C.", *Materials Letters*, vol. 24, Jun. 1995, pp. 109-112.
Westwater et al., "Si Nanowires Grown Via the Vapour-Liquid-Solid Reaction", *Phys. Stat. Sol.*, vol. (a)165, 1998, pp. 37-42.
Westwater et al., "The Characteristics and Oxidation of Vapor-Liquid-Solid Grown Si Nanowires", *Mat. Res. Soc. Symp. Proc.*, vol. 452, 1997, pp. 237-242.
Westwater, J., et al., "Control of the size and position of silicon nanowires grown via the vapor-liquid-solid technique", *Japanese Journal of Applied Physics*, Part 1, Oct. 1997, pp. 6204-6209, vol. 36.
Whang et al., "Large-Scale Hierarchical Organization of Nanowire Arrays for Integrated Nanosystems", *Nano Letters*, vol. 3, No. 9, Aug. 5, 2003, pp. 1255-1259.
Wong, E., et al., "Nanobeam Mechanics: Elasticity, Strength, and Toughness of Nanorods and Nanotubes", *Science*, Sep. 26, 1997, pp. 1971-1975, vol. 277.
Wu et al., "Growth, Branching, and Kinking of Molecular-Beam Epitaxial <110> GaAs Nanowires", *Applied Physics Letters*, vol. 83, No. 16, Oct. 20, 2003, pp. 3368-3370.
Wu et al., "Single-Crystal Metallic Nanowires and Metal/Semiconductor Nanowire Heterostructures", *Nature*, vol. 430, Jul. 1, 2004, pp. 61-65.
Wu, Y., et al., "Block-by-Block Growth of Single-Crystalline Si/SiGe Superlattice Nanowires", *Nano Letters*, Jan. 19, 2002, pp. 83-86, vol. 2, No. 2.
Wu, Y., et al., "Direct Observation of Vapor-Liquid-Solid Nanowire Growth", *J. Am. Chem. Soc.*, Mar. 13, 2001, pp. 3165-3166, vol. 123.
Wu, Y., et al., "Germanium Nanowire Growth via Sample Vapor Transport", *Chem. Mater*, Mar. 20, 2000, pp. 605-607, vol. 12.
Wu, Y., et al., "Germanium/Carbon Core-Sheath Nanostructures", *Applied Physics Letters*, Jul. 3, 2000, pp. 43-45, vol. 77, No. 1.
Wu, Y., et al., "Inorganic Semiconductor Nanowires: Rational Growth, Assembly, and Novel Properties", *Chemistry—A European Journal*, Mar. 15, 2002, pp. 1261-1268, vol. 8, No. 6.
Wu, Y., et al., "Melting and Welding Semiconductor Nanowires in Nanotubes", *Advanced Materials*, Apr. 4, 2001, pp. 520-523, vol. 13, No. 7.
Wu, Y., et al., "Rational Synthesis of Inorganic Nanowires" *Abstracts of Papers in the Amer. Chem. Soc.*, Apr. 1, 2001, pp. 108—Iec Part 1, vol. 221.
Wu, Y., et al., "Semiconductor Nanowire Array: Potential Substrates for Photocatalysis and Photovoltaics", *Topics in Catalysis*, Apr. 1, 2002, pp. 197-202, vol. 19, No. 2.
Wu, Y., et al., "Superconducting MgB2 Nanowires", *Advanced Materials*, Oct. 2, 2001, pp. 1487-1489, vol. 13, No. 19.
Xia, Y., et al., "Chemistry and Physics of Nanowires", *Advanced Materials*, Mar. 4, 2003, pp. 351-352, vol. 15, No. 5.
Xia, Y., et al., "One-Dimensional Nanostructures: Synthesis, Characterization, and Applications", *Advanced Materials*, Mar. 4, 2003, pp. 353-389, vol. 15, No. 5.
Yan, H., et al., "Dendritic Nanowire Ultraviolet Laser Array", *J. Am. Chem. Soc.*, Mar. 29, 2003, pp. 4728-4729, vol. 125, No. 16.
Yan, H., et al., Morphogensis of One-Dimensional ZnO Nano- and Microcrystalsm, *Advanced Materials*, Mar. 4, 2003, pp. 402-405, vol. 15, No. 5.
Yang, "From Nanowire Lasers to Quantum Wire Lasers", *Proceedings of SPIE*, vol. 5349, 2004, pp. 18-23.
Yang, "Semiconductor Nanowire Array", *Proceedings of the SPIE*, vol. 4806, 2002, pp. 222-224.
Yang, P., et al., "Controlled Growth of ZnO Nanowires and their Optical Properties", *Advanced Functional Materials*, May 2002, pp. 323-331, vol. 12, No. 5.
Yang, P., et al., "Inorganic Nanowires: Rational Synthesis, Functional Assemblies and Novel Properties", *Abstracts of Papers in the Amer. Chem. Soc.*, Apr. 7, 2002, pp. 343—Inor Part 2, vol. 223.
Yang, P., et al., "Langmuir-Blodgett Assembly of One-Dimensional Nanostructures", *Chemphyschem*, Jun. 17, 2002, pp. 503-506, vol. 3, No. 6.
Yang, P., et al., "Nanowires from Vapor Condensation and their Assemblies", *Abstracts of Papers in the Amer. Chem. Soc.*, Mar. 26, 2000, pp. 269—Inor Part 1, vol. 219.
Yao, Z., et al., "Carbon Nanotube Intramolecular Junctions", *Nature*, Nov. 18, 1999, pp. 273-276, vol. 402.
Yazawa, M. et al, "Heteroepitaxial Ultrafine Wire-Like Growth of InAs on GaAs Substrates", *Applied Physics Letters*, Mar. 11, 1991, pp. 1080-1082, vol. 58, No. 10.
Yazawa, M., "Nanocolumns composed of GaAs-InAs jointed whiskers and Si02 covers", *Applied Physics Letters*, Aug. 29, 1994, pp. 1157-1158, vol. 65.
Yazawa, M., et al., "Effect of one monolayer of surface gold atoms on the epitaxial growth of InAs nanowhiskers", *Applied Physics Letters*, Oct. 26, 1992, pp. 2051-2053, vol. 61.
Yu et al., "Silicon Nanowires: Preparation, Device Fabrication, and Transport Properties", *J. Phys. Chem. B.*, vol. 104, No. 50, Nov. 23, 2000, pp. 11864-11870.
Zhang, Y., et al., "Heterostructures of Single-Walled Carbon Nanotubes and Carbide Nanorods", *Science*, Sep. 10, 1999, pp. 1719-1722, vol. 285.
Zheng, B., et al., "Synthesis of Ultra-Long and Highly Oriented Silicon Oxide Nanowires from Liquid Alloys", *Advanced Materials*, Jan. 16, 2002, pp. 122-124, vol. 14, No. 2.
Zhong et al., "Nanowire Crossbar Arrays as Address Decoders for Integrated Nanosystems" *Science*, vol. 302, Nov. 21, 2003, pp. 1377-1379.
Zhong, Z., et al., "Synthesis of P-Type Gallium Nitride Nanowires for Electronic and Photonic Nanodevices", *Nano Letters*, Feb. 20, 2003, pp. 343-346, vol. 3, No. 3.
Zhou, C.W., et al., "Modulated chemical doping of individual carbon nanotubes", *Science*, Nov. 24, 2000, pp. 1552-1555, vol. 290.
Zwiller, V., et al., "Single quantum dots emit single photons at a time: Antibunching experiment", *Applied Physics Letters*, Apr. 23, 2001, pp. 2476-2478, vol. 78, No. 17.
Supplemental European Search Report, European Application No. 07861102.7, dated Sep. 11, 2012.

(56) References Cited

OTHER PUBLICATIONS

Kikuchi et al., "InGaN/GaN Multiple Quantum Disk Nanocolumn Light-Emitting Diodes Grown on (111) Si Substrate," Japanese Journal of Applied Physics, vol. 43, No. 12A, Dec. 1, 2004, pp. L1524-1526.
Korean Notice of Preliminary Rejection, Korean Application No. 2009-7012822, dated Nov. 11, 2013.

* cited by examiner

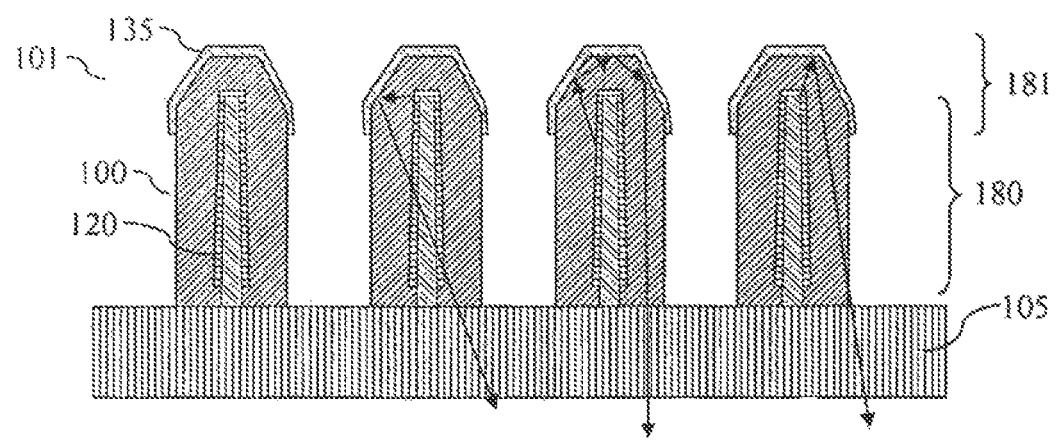
*Fig. 1a*
  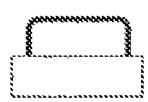   
FIG. 2A    FIG. 2B    FIG. 2C    FIG. 2D    FIG. 2E    FIG. 2F

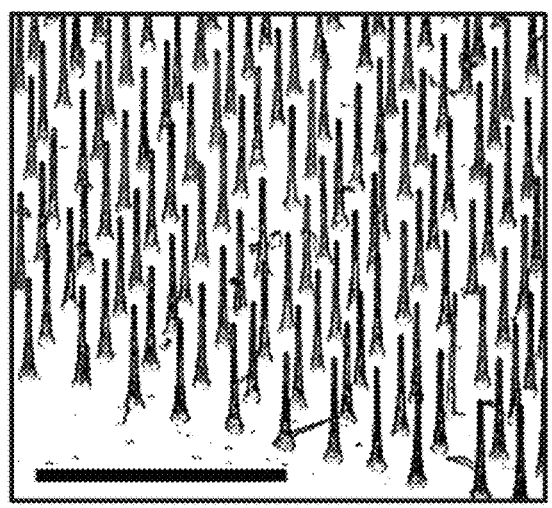
Fig. 9
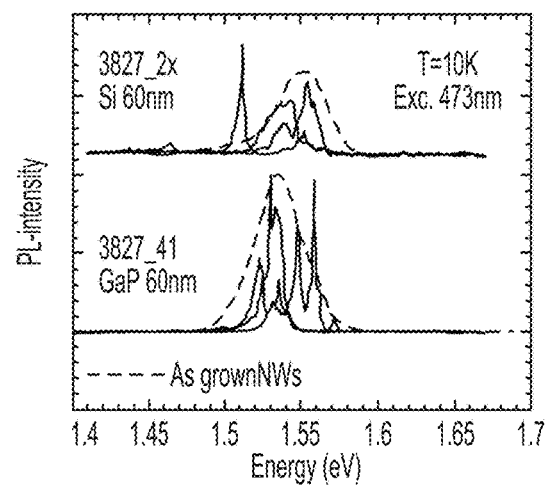
Fig. 10a
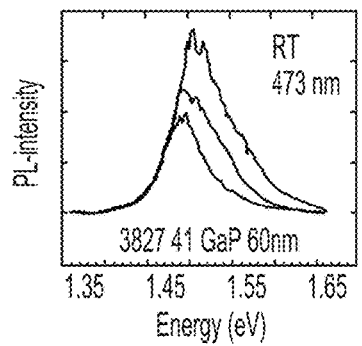 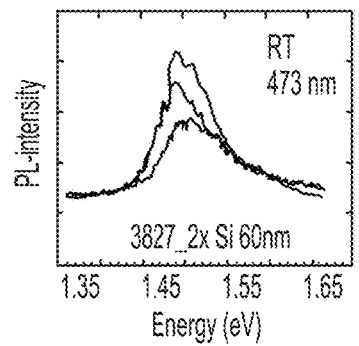
Fig. 10b    Fig. 10c

NANOSTRUCTURED LED ARRAY WITH COLLIMATING REFLECTORS

TECHNICAL FIELD

The present invention relates to light emitting diodes, LEDs. In particular the invention relates to a nanostructured LED device comprising arrays of nanostructures.

BACKGROUND

The today dominating type of light emitting diodes (LEDs) are built on planar technology. The PN-junction is constructed as a plurality of layers on a substrate giving a device with an essentially horizontal orientation. The light-producing re-combination takes place in a subset of these layers. As the semiconductor layers have refractive indexes that are substantially higher than the refractive index of the air, a substantial portion of generated light will be reflected in the layers and not contribute to the effective luminescence of the device. In fact the layers will act as a waveguide in the horizontal plane of the LED. Measures have been suggested to mitigate the effects of the light of LED being trapped in the device and to efficiently extract the light out of the semiconductor layers. Such measures include modifying the surface in order to provide portions with varying angles to the horizontal plane. A similar approach is suggested in EP1369935, wherein nanosized particles are provided in the LED device to scatter light or alternatively absorb light and generate light of a different wavelength. In addition the planar technology imposes constrains in terms of miniaturization and choices of suitable materials, which will be further described below.

The development of nanoscale technology and in particular the ability to produce nanowires has opened up possibilities of designing structures and combining materials in ways not possible in planar technology. One basis for this development is that the 1D properties of a nanowire makes it possible to overcome the requirement of lattice matching between different materials in a device made with planar technology. It has been shown and utilized that nanowires of for example InP can be grown on InAs or Si without defects. In US 20040075464 by Samuelson et al., a plurality of devices based on nanowire structures are disclosed, for example nanowire LEDs. These LEDs have an internal heterostructure giving quantum confinement effects.

US20030168964 teaches an assembly of a plurality of nanowires acting as LEDs mounted in groups between a conductive transparent substrates at the lower end of the nanowires and a transparent cover substrate at the top end, each individual nanowire having a structure of P-type, N-type and light emitting layer. The nanowires are said to be arranged to emit light through the conductive transparent substrate.

Other nanowire LED have previously been reported. Hiruma et al., fabricated vertical GaAs nanowire pn LEDs. The nanowires were embedded in an SOG and covered with an Au/Ge/Ni top contact described in "GaAs p-n junction formed in quantum crystals" by Haraguchi et al., Appl. Phys. Lett. 60 (6) 1992. These devices showed room temperature electro luminescence. GaN based nanowire LEDs have also been fabricated as described in "Core/Multishell Nanowire Heterostructure as Multicolor, High-Efficiency Light-Emitting Diodes" by Quian et al., Nanoletters.

SUMMARY OF THE INVENTION

It has in the art been shown that nanostructures can be utilised for constructing LED devices. To fully take advantage of the possibilities offered by the nanotechnology further improvements with regards to efficiency are needed.

The object of the present invention is to provide a nanostructured LED device and a method of producing such overcoming the drawbacks of the prior art devices and methods.

The nanostructured LED device according to the invention comprises an array of a plurality of individual nanostructured LEDs. Each of the nanostructured LEDs has an active region wherein light is produced. The nanostructured device further comprise a plurality of reflectors, each associated to one individual nanostructured LED, or a group of nanostructured LEDs. The individual reflectors has a concave surface facing the active region of the respective individual nanostructured LED or active regions of group of nanostructured LEDs.

The nanostructured LED device according to the invention can be seen as comprising a LED array layer and a reflector layer. The plurality of nanostructured LEDs forms the LED array layer, with a corresponding plurality of active regions arranged in the layer The reflector layer is arranged in a plane parallel to the LED array layer and comprises a plurality of reflectors each having a concave surface facing one or a group of active regions and arranged to direct light through the LED array. The periodicity of reflectors of the reflector layer may relate to the periodicity of the nanostructured LEDs, or their associated active regions.

In one embodiment of the invention each reflector covers the upper surface, and optionally a part of the side surface, of an elongated nanostructured LED, typically a LED form from a nanowire.

In one embodiment the nanostructured LEDs are of pyramidal shape and the reflector covers essentially all sides of the nanostructured LED except for the side facing the substrate.

The individual reflectors may be joined to form a continuous reflecting layer. In one embodiment the continuous reflecting layer covers both the upper surface of the nanostructured LEDs and a filler layer that has been provided to fill the space in between the nanostructures.

The reflectors or the continuous reflecting layer may be provided directly on the nanostructured LEDs. Alternatively a spacer material is provided there between to define the shape of the reflectors. A contact or contact layer may also be provided between the reflectors and the nanostructured LEDs. One alternative is to use the continuous reflecting layer also as a upper contact to the nanostructured LEDs.

One advantage of the present invention is that the efficiency of nanostructured LED devices can be sufficiently increased. A further advantage is that the nanostructured LED devices can be fabricated with established methods.

Yet a further advantage with the nanostructured LED according to the invention is that the fabrication can be adapted to cost efficient industrial production.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein:

FIGS. 2A-2F illustrate schematically the reflector according to the invention;

FIG. 9 is a SEM image of nanowire structures of the invention after the first MOVPE step;

FIGS. 10A-10C are photoluminescence graphs of nanowires and LED nanostructure according to FIG. 7 and FIG. 9;

DETAILED DESCRIPTION

Figure 1B:
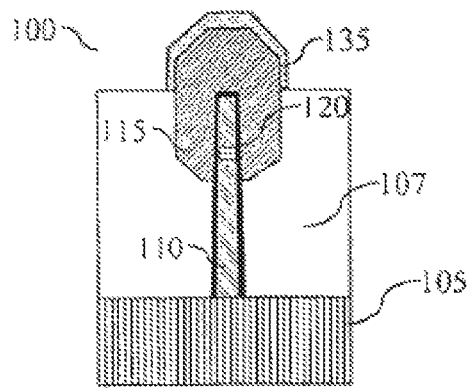
FIG. 1A illustrates schematically a nanostructured LED device according to the invention and FIGS. 1B-1E upstanding individual nanostructured LEDs utilised in the nanostructured LED device according invention.

A nanostructured light emitting diode, LED, device according to the invention comprises an upstanding nanostructured LEDs. The individual nanostructured LED are for example formed by the use of nanowires. The nanowires are either utilised as an active element in the LED or as a building block for nanostructures, wherein the nanowire makes it possible to fabricate the nanostructures with materials that otherwise would not match the materials of a substrate, for example. Suitable methods for growing nanowires on semiconductor substrates are described in US 2003010244. Methods of providing epitaxally grown nanowires with heterostructures are to be found in US 20040075464. Nanostructured LEDs may also be formed by other means, for examples as InGaN/GaN hexagonal pyramid structures on a GaN substrate as indicated in "Spatial control of InGaN luminescence by MOCVD selective epitaxy" by D. Kapolnek et al., J. of Crystal Growth 189/190 (1998) 83-86.

For the purpose of this application an upstanding nanowire should be interpreted as a nanowire protruding from the substrate at some angle, the upstanding nanowire for example grown epitaxially from the substrate. The angle with the substrate will typically be a result of the materials in the substrate and the nanowire, the surface of the substrate and growth conditions. By controlling these parameters it is possible to produce nanowires pointing in only one direction, for example vertical, or in a limited set of directions. For example nanowires and substrates of zinc-blende and diamond semiconductors composed of elements from columns III, V and IV of the periodic table, such nanowires can be grown in the (111) directions and then be grown in the normal direction to any {111} substrate surface. Other directions given as the angle between normal to the surface and the axial direction of the nanowire include 70.53° {111}, 54.73° {100}, and 35.27° and 90°, both to {110}. Thus the nanowires define one, or a limited set, of directions.

All references to upper, top, lower, downwards etc are made as considering the substrate being at the bottom and the nanowires extending upwards from the substrate. Vertical refers to a direction parallel to the longer extension of the nanowire, and horizontal to a direction parallel to the plane formed by the substrate. This nomenclature is introduced for the easy of understanding only, and should not be considered as limiting to specific assembly orientation etc.

A nanostructured LED device 101 according to the invention is schematically illustrated in FIG. 1a and comprises at least one array of nanostructured LEDs 100, each with an individual active region 120 wherein light is produced. The nanostructured LEDs have during fabrication been grown from a substrate 105. The nanostructured LED device 101 according to the invention is designed as that is commonly referred to as a "flip-chip" configuration, and the light is extracted through the substrate 105. Alternatively the substrate has been removed during fabrication and the light is emitted directly from the nanostructures LEDs 100, or through a buffer layer or protective layer (not shown) covering the lower surface of the nanostructured LEDs 100. According to the invention the produced light is directed at least partly by means of a reflectors 135 positioned in proximity to the opposite end of the nanostructured LEDs compared to the end of the nanostructured LEDs there the light leaves the device, i.e. close to the top end. The reflectors 135 collimates or focus the light emitted from the active region in the direction towards the substrate. The collimation of the light towards the normal direction of the nanostructured LED array and substrate plane is advantageous for light extraction of the device as it decrease internal reflection. Highly directional light emission is also advantageous for several LED applications. The light is collimated as the reflectors 135 has an essential concave surface facing the active region 120. Concave surface should here be given a very broad interpretation, as illustrated in FIG. 2a-f including but not limited to a cross section forming: a continues curve (a), an open rectangle (b), an open rectangle with smooth corners (c), a plurality of straight parts joined with varying angles (d), two legs of a triangle (e), or a plurality of continues curves (f). Collimating should also be interpreted broadly, indicating that the light leaving the LED device has a generally preferred direction, not necessarily strictly parallel.

The reflector may be deposited as a highly reflective metal layer on top of the structure formed during growth and/or subsequent processing. Typical materials for the reflector include but is not limited to Ag, Al (for LEDs in green and blue color range with the wavelength λ<500 nm), same and Au for LEDs in infrared, red, orange and amber color range. Also multilayered structure comprising repeated layers of AlGaAs/GaAs or GaN/AlGaN, for example, may be used as reflectors. The deposition methods for the reflector include but are not limited to evaporation, sputtering, electrochemical or electroless plating. In order to protect the reflector from corrosion and oxidation an additional protective dielectric layer may be formed, for example from $SiO_2$, $Si_3N_4$ or similar material. In this layer openings may be structured to provide electrical contact to the reflector.

The dimensions of an individual reflector in a nanostructured LED device according tot the invention will vary greatly depending on the implementation, not at least on the size and shape of the individual nanostructured LEDs. Typical diameters and heights range from tenth of nanometers to several micrometers in the widest parts. According to one embodiment of the invention the inner concave surface of each individual reflector 135 is defined by the contour of a at least the upper surface of respective individual nanostructured LED. A part or all of the side surfaces of the nanostructured LED may also define parts of the reflector.

The nanostructured LED device 101 may be seen as a vertically layered device with a LED array layer 180 comprising a plurality of nanostructured LEDs 100 with a corresponding plurality of active regions 120 arranged within the LED array layer 180. In a plane parallel to the LED array layer 180 is a reflector layer 181 comprising the plurality of reflectors 135 having a concave surface facing one or a group of active regions and arranged to direct light through the LED array 180. According to one embodiment of the invention the periodicity of the individual reflectors 135 of the reflector layer 181 is related to the periodicity of the individual nanostructured LEDs. The periodicity of the reflector layer 181 may relate to the periodicity of the LED array layer 180 as a series of n or 1/n, n=1, 2, 3 . . . . As an alternative the reflector layer 181 has a random configuration or a periodicity which is not correlated to the periodicity of the LED array layer 180.

The close positioning relative the nanostructure array and the irregular shape of the reflector gives further advantages; the layer can have multiple usage. It can function as a heat conductor with a higher efficiency than in traditional planar LEDs due to the close proximity to the active area and a higher relative surface junction area of the joint semiconductor and reflector material in comparison to the area of the active region. It is also advantageous as an electrical contact to the LED array, also due to close proximity and high relative surface area of the junction. This multipurpose layer may in this way facilitate device design for LED efficiency.

Devices based on nanostructured LEDs do fundamentally differ from traditional planar LEDs as light is emitted from a number of individual light sources instead of one continuous plane. Any array design can be realized by lithographic means. The pitch and pattern of such arrays of LEDs may vary. In this invention it is advantageous to configure an array to photonic crystal character, such as triangular and hexagonal arrays where the pitch is close to ½ of the wavelength of the emitted light in order to inhibit light emission in directions close to the plane of the array. This use of a photonic crystal design in the active array is essentially different from the use of photonic crystal patterns positioned outside the active region and in the proximity of the interface where the light is aimed to be extracted from the semiconductor, as the suggested use of the photonic crystal properties is aimed to align light towards both mirror and the final light extraction interface from the semiconductor. For light ranging from UV to IR the pitch of such array can be said to roughly range within 0.1-4 μm. The specific size of the individual LEDs may often be limited by the choice of array pitch.

Nanostructured LEDs according to the invention are schematically illustrated in FIG. 1b-e. FIG. 1b illustrates a nanostructured LED formed of a nanowire 110 and comprises a substrate 105, wherein the nanowire 110 has been epitaxially grown from the substrate 105. A portion of the nanowire 110 is enclosed by a volume element 115. The volume element 115 is preferably epitaxially connected to the nanowire 110. A pn-junction necessary for the diode functionality is formed in the volume element 115 or alternatively in the nanowire 110. A top contact is provided on the volume element 115, for example on top, or in a wrapping configuration on the circumferential outer surface.

The nanostructured LED 100 may be contacted in the other end for example via the substrate, forming a common bottom contact, through a dedicated contacting layer close to the substrate, or by a wrap contact at the lower end of the nanowire 110. A wrap contact may be L-shaped or the length of the contact to the nanowire defined by the thickness of a contacting layer. The nanowire 110 typically has a diameter in the order of 50 nm to 500 nm, and the volume element a diameter in the order of 500 nm to 10 μm. The length of the portion of the nanowire not covered by the volume element, may vary from 10 nm to several μm depending on the application. The length of the volume element is typically and preferably in the order of 1 to 5 μm. The volume element 115, or bulb, may have different shape and the volume element and nanowire in combination designed to give different position and shape or the active region giving the recombination conditions required for the light production. The volume element 115 may further provide a high degree of doping and the charge carriers are injected into the nanowire. According to the present invention the nanostructured LEDs are designed to direct the light out of the device through the substrate 105, or alternatively through a support structure if the substrate has been removed, i.e. referring to the figures, the light is directed in a downwards direction. According to the invention the produced light is directed at least partly by means of a reflector 135 positioned in proximity to the opposite end of the nanowire compared to the end of the nanowire there the light leaves the device, i.e. close to the top end of the nanowire 110. The depleted reflector 135 has a cross section which follows from the cut-off pyramid top part of the volume element 115, which is a shape that can be made with known methods. As seen in the figure, the shape of the reflector follows the shape of the volume element 115, which from a production viewpoint represents a preferred embodiment. However as discussed above, many different shapes can be envisaged and fabricated, and the depicted shape and that the shape is given by the volume element is to be considered as a non limiting example.

Figure 1C:
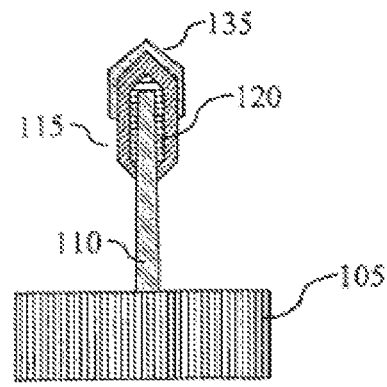

FIG. 1c illustrates another design wherein the volume element 115 comprises a plurality of layers 116, 117 in a shell-like structure. A doping layer 117 provides the p or n region and the well layer 116 comprises the active region 120 under operation. Alternatively the well can be made out of a plurality of sub-layers. The structure may comprises other layers (not shown) for enhancing doping properties, improve contacting etc. In this embodiment the active region 120 will primarily be outside of the nanowire 110. The reflector 135 does in this embodiment enclose the shell-like structure. The volume element/shell-structure is here depicted with a pointed upper end, which represents one possible and technical achievable implementation. As the reflector through existing deposition techniques can be made to adhere to the volume element the desired essentially concave shape is achieved. The examples of contacting, dimensions etc discussed above is relevant also for this embodiment. The nanostructured LEDs (100) of the embodiments schematically illustrated in FIG. 1a-c can be described as elongated structures with an upper part, which is pointed. Pointed should in this case be understood to include also shapes with a the outermost top cut-off as illustrated. The nanostructured LED further has an elongated cylindrical part with a vertical surface. The term vertical surface is to include also the surface of an elongated cone.

Figure 1D:
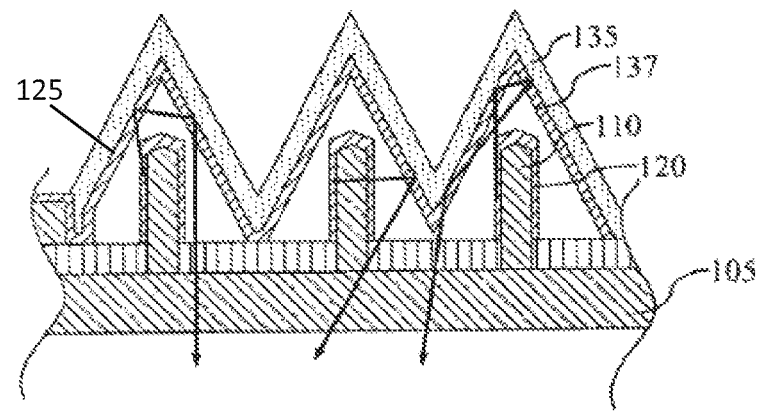

A further embodiment is illustrated in FIG. 1d, wherein the nanowire 110 is enclosed by a pyramidal overgrowth forming the volume element 115. The active region 120 may in this case be formed in the nanowire, or if a shell-like structure is provided as depicted, in the volume element. The reflector 135 follows the pyramidal shape and forms a corresponding pyramid, i.e. the depicted cross section will be triangular. In the illustrated example a contact 137 is provided in between the volume element 115 and the reflector 135.

Figure 1E:
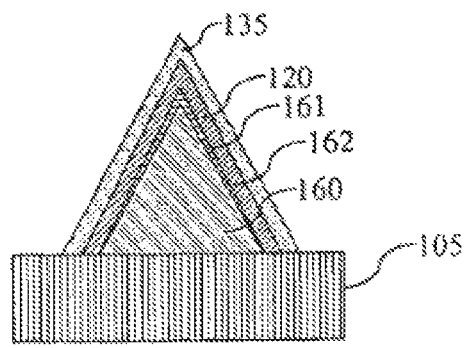

Illustrated schematically in FIG. 1e is a nanostructured LED formed without the aid of a nanowire. A pyramid 160 of a first semiconductor material is formed on the substrate 105 and by growing subsequent semiconductor layers 161, 162 a pn junction may be formed, giving an active region 120. Also a structure of this type can be provided with a reflector 135 according to the present invention.

The thin arrows in the FIGS. 1a-e represent possible reflecting paths of the light emitted from the active regions, and illustrates the collimating effect towards the substrate 105.

In all the embodiments the contacting means are required on the volume element forming a top contact. The top contact may be positioned between the volume element and the reflector, and if so, preferably is of a transparent or semi transparent material. One alternative, illustrated in FIG. 1d, but realizable also in other designs, is a transparent contacting layer 125 covering the volume element and a reflector 135 in the form of a layer on top of the contacting layer 125. A further alternative is that the reflector 135, for example in the form of a layer, serves as both contact and reflector.

The substrate 105 and part of the upstanding structure may be covered by a cover layer 107, for example as a thin film or as material filling the space surrounding the nanostructured LED, as Illustrated in FIG. 1b.

Figure 3A:
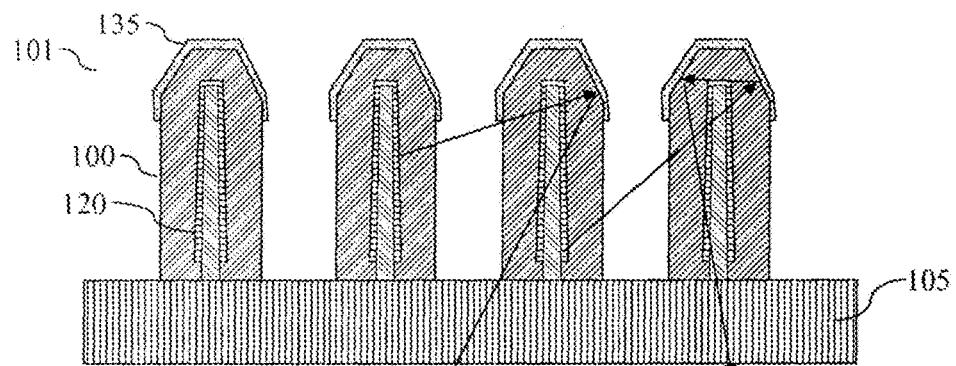
FIGS. 3A-3C illustrate schematically different embodiments of the a nanostructured LED device comprising reflectors according to the invention.

According to the embodiments depicted in FIG. 1a-e, a reflector 135 can be associated to each nanostructure LED 100. as Illustrated in FIG. 3a, wherein a device comprising a plurality of nanowires is depicted. The reflector covers only one nanostructure LED, but as indicated by the thin arrows representing light paths, may contribute in collimating light emitted from other active regions 120.

Figure 3B:
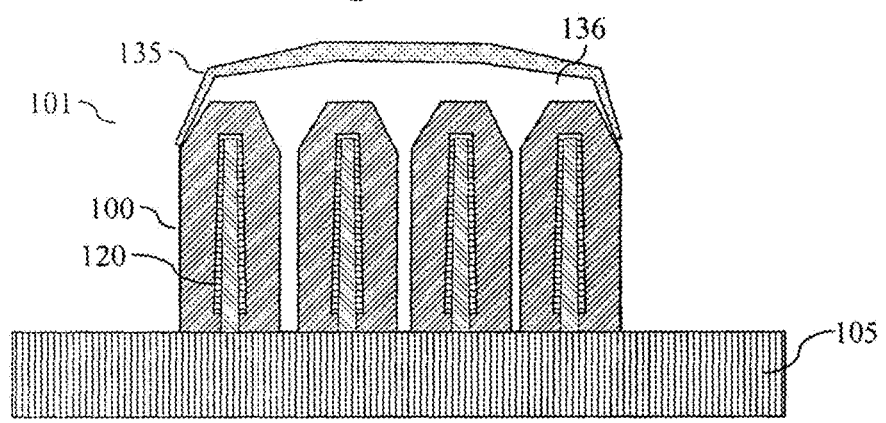

Alternatively, as illustrated in FIG. 3b, a reflector 135 is associated with a plurality of nanostructure LEDs. If seen in the direction of the nanowires and towards the substrate the reflector 135 covers the active regions 120 of the plurality of nanostructure LEDs. Preferably a spacing material 136 with suitable optical properties is provided between the nanostructure LEDs and the reflector 135. The spacing material 136 may facilitate the forming of the concave reflector. The spacing material should be transparent for the light of the emitted wavelength. It may be a dielectric, for example $SiO_2$. $Al_2O_3$, or $Si_3N_4$ deposited using methods like sputtering, evaporation or CVD. Alternatively, it may be a semiconductor material deposited during epitaxial growth under conditions different from individual nanostructured LED growth. It can be made electrically conductive to facilitate contacting through the reflector.

Figure 3C:
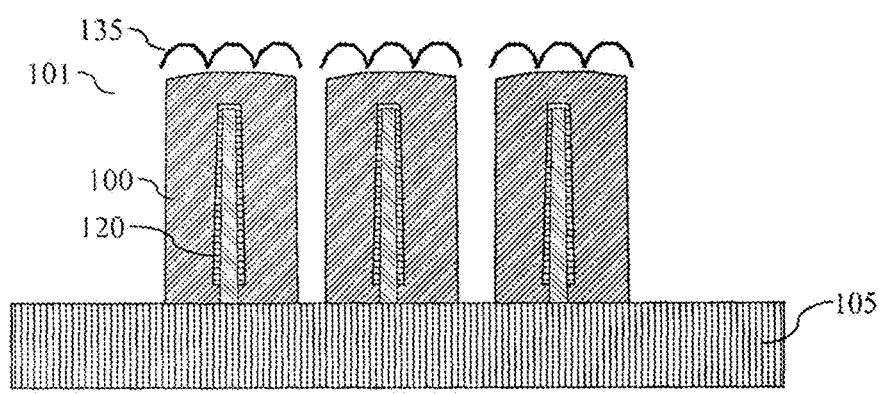

A further alternative is schematically illustrated in FIG. 3c, wherein the cross section of the reflector 135 is substantially smaller than the diameter of the nanostructure LEDs, and a plurality of reflectors can be associated to each nanostructure 100. In order to achieve this shape the upper surface of the individual nanostructured LEDs may be structured using etching or laser texturing methods.

According to one embodiment of the invention the nanowire of the nanostructured LED is used as a waveguide directing at least a portion of the light produced by the nanostructured LED in a direction given by the upstanding nanowire. The ideal waveguiding nanowire LED structure includes a high refractive index core with one or more surrounding cladding with refractive indexes less than that of the core. The structure is either circular symmetrical or close to being circular symmetrical. Light generation waveguiding in circular symmetrical structures are well know for fiber-optic applications and many parallels can be made to the area of rare-earth-doped fiber amplifiers and lasers. However, one difference is that fiber amplifier are optically pumped while the described nanowire LED structure can be seen as electrically pumped. One well know figure of merit is the so called Numerical Aperture, NA: $NA=\sqrt{n_1^2-n_2^2}$, wherein $n_1$ and $n_2$ are the refractive indexes of the core and cladding, respectively. The NA determined the angle of light captured by the waveguide. For light generated inside the core of the waveguide the angle of capture, $\varphi$, can be determined as $n_1 \cos(\varphi)=n_2$. The NA and angle of captured light is an important parameter in the optimization of a new LED structure.

Typical values for III-V semiconductor core material is refractive indexes in the range from 2.5 to 3.5. When combined with glass type of cladding material such as $SiO_2$ or SiN having refractive indexes ranging from 1.4 to 2.0, the angle of capture can be as high as 65 degrees. An angle of capture of 65 degrees yield that up to 75% of the light generated can be captured and guided by the structure (both directions).

One consideration in the optimization of light extraction is to made the NA vary along the nanowire structure to optimize light extraction from the structure. In general, it is ideal to have the NA be highest when the light generation takes place furthest away from the exit location. This will maximize the light captured and guided toward the exit. In contrast, closer to the exit end of the structure, the NA can be made smaller since light generated will radiate in random directions and most of the radiate light will hit the top and side of the top part of the structure and exit. Having a lower NA in the top part of the structure also minimizes the light captures and guide back down through the structure which may not be ideal unless a reflector is inserted in the bottom of the structure. A low NA can be obtained by surrounding the III-V nanowire core with another III-V cladding of different composition with slightly less refractive index.

Figure 4A:
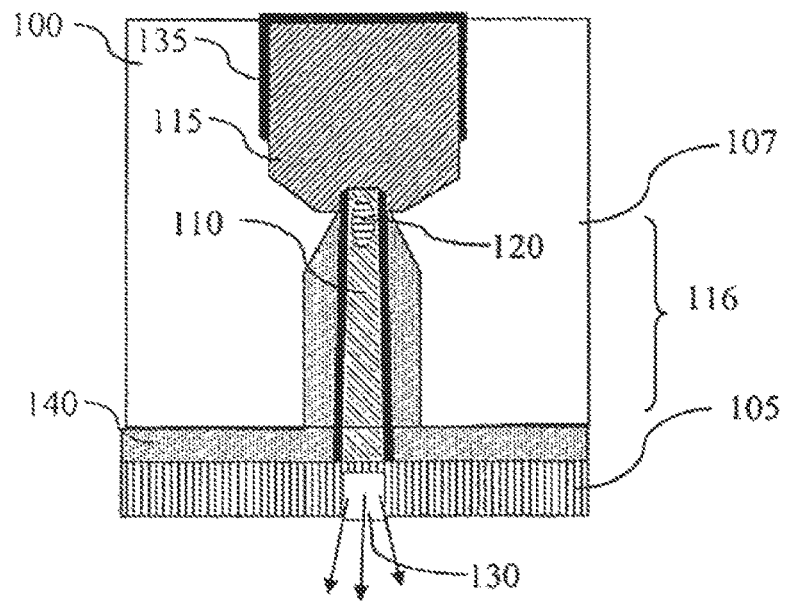
FIGS. 4A-4B illustrate schematically embodiments of a nanostructured LED comprised in a nanostructured LED device according to the invention.

According to the embodiment schematically illustrated in FIG. 4a, the nanowire 110, or a portion of the nanowire 110. is arranged to form a waveguide 116 directing at least a portion of the produced light in a general direction given by the elongated direction of the nanowire. This functionality of the nanowire is in the figure illustrated with thin arrows. The pn-junction results in an active region 120 arranged in the nanowire, or in the vicinity of the nanowire, wherein the light is produced. It should be noted that the position of active region 120 in FIG. 4a is a non-limiting example. The materials of the different members of the nanostructured LED are chosen so that the nanowire will have good waveguiding properties vis-à-vis the surrounding materials, i.e. the refractive index of the material in the waveguide 116 should be larger than the refractive indices of the surrounding materials. If the nanowire 110 or waveguide 116 has a first refracting index, $n_w$, the material surrounding the nanowire in wave guide portion 116, typically the cover layer 107, a second refractive index, $n_c$, and the volume element a third refractive $n_{ve}$., $n_w>n_c$ and $n_w>n_{ve}$. Typical values for the nanostructured LED are $n_w\approx3$, $n_c\approx1.5$ and $n_{ve}\approx3$.

The waveguide 116 may be provided with one or more cladding layers. A first cladding layer 112, may be introduced to improve the surface properties of the nanowire, fore example if a GaAs nanowire is utilized it has been shown that the properties are improved by adding a cladding layer 112 of GaInP. Further cladding layers, for example an optical cladding layer 113 may be introduced specifically to improve the waveguiding properties of the waveguide 116, in manners similar to what is well established in the area of fiber optics. The optical cladding layer 113 typically has a refractive index in between the refractive index of the nanowire and the surrounding material. Alternatively the cladding layer 113 has a graded refractive index, which has been shown to improve light transmission in certain cases. If an optical cladding layer 113 is utilised the refractive index of the nanowire, $n_w$, should define an effective refractive index for both the nanowire and the cladding layers.

The ability to grow nanowires with well defined diameters, as described in the above cited references and exemplified below, is in one embodiment of the invention utilised to optimise the waveguiding properties of the nanowire 110, or at least the waveguide 116. With regards to the wavelength of the light produced by the nanostructured LED 100. As is well known the re-combination process that is the basis for the light production of a LED, produces light in a narrow wavelength region, dependent on the material properties. In the embodiment the diameter of the nanowire 110 is chosen so as to have a favourable correspondence to the wavelength of the produced light. Preferably the dimensions of the nanowire 111 are such that an uniform optical cavity, optimised for the specific wavelength of the produced light, is provided along the nanowire. The core nanowire must be sufficiently wide to capture the light. A rule of thumb would be that diameter must be larger than $\lambda/2n_w$ wherein $\lambda$ is the wavelength of the produced light and $n_w$ is the refractive index of the nanowire 110.

For a nanostructured LED arranged to produce light in the visible region the diameter of the waveguiding portion of the nanowire should preferably be larger than 80 nm in order for the nanowire to be an effective waveguide. In the infra-red and near infra-red a diameter above 110 nm would be sufficient. An approximate preferred upper limit for the diameter of the nanowire is given by the growth constrains, and is in the order of 500 nm. The length of the nanowire 110 is typically and preferably in the order of 1-10 μm, providing enough volume for the active region 120, and at the same time not unnecessarily long to cause internal absorption.

According to the embodiment illustrated in FIG. 4a the waveguiding properties of the nanowire 110 are combined with the collimating effects of the reflector 135 to further enhance the extraction of light through the substrate 105. A substantial portion of the light generated in the active region 120 will be led in the downward direction by the nanowire. However, a portion of the light will be emitted in directions not "captured" by the waveguide 116. This portion of the light can be reflected by the reflector 135 in a direction towards the substrate, either via the waveguide 116 or via other parts of the nanostructure.

Figure 4B:
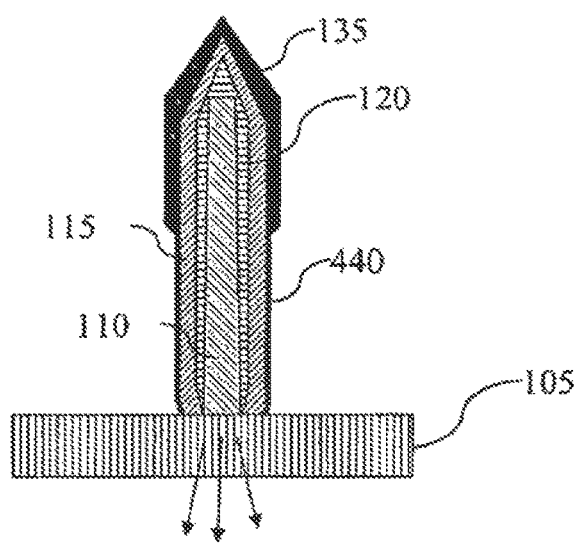

In the embodiment schematically illustrated in FIG. 4b light is generated in an active region 120 essentially located radially outside of the nanowire 110, i.e. corresponding to the embodiment with a shell-like structure described with reference to FIG. 1b. In this embodiment the volume element is provided with a cladding layer 440 to give the volume element waveguiding properties. The reflector 135 on top of the volume element 115 provides for downward reflection of at least a portion of the light emitted in upward directions.

In the above embodiments, for the reason of not obscuring the understanding, it has been described that light is emitted through the substrate 105. However, in a LED device comprising nanostructured LEDs, the substrate may have been removed, or provided with cut out 130 as illustrated in FIG. 4a, to facilitate the emission of light. Other layers such as a buffer layer, for example of GaN, for enhancing the nucleation of nanowires, or protective layers, for example of $SiO_2$, may be present adjacent to the nanowires. The substrate may be removed using lapping and etching methods whereby the substrate material is machined or etched away. Alternatively, a lift-off process may be used to separate the epitaxially grown structure from the substrate.

Figure 5A:
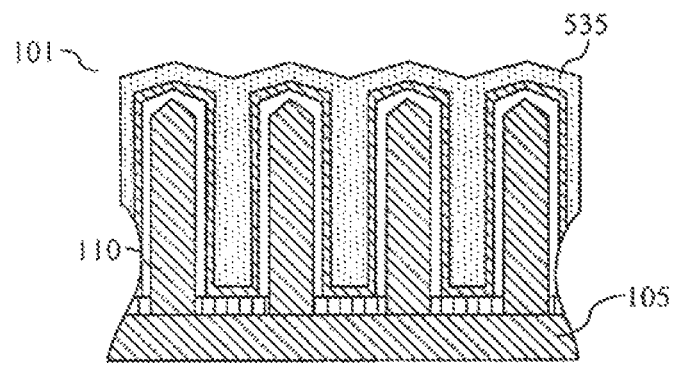
FIGS. 5A-5C illustrate schematically embodiments of a nanostructured LED device according to the invention.
Figure 5B:
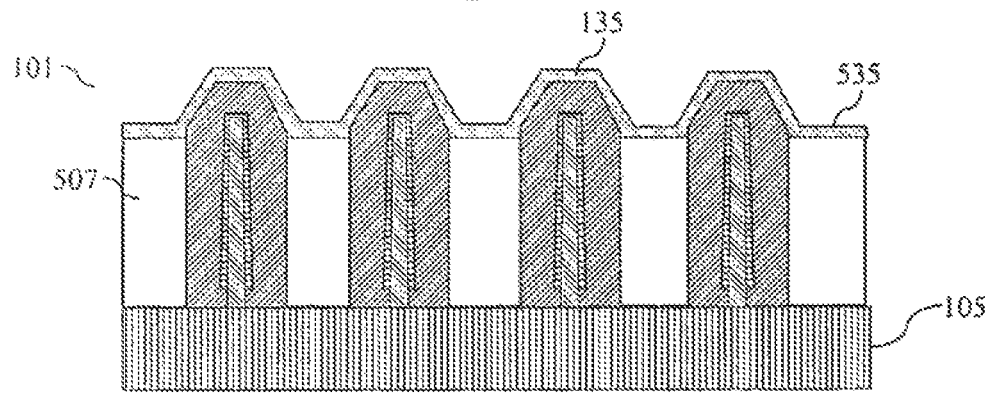

The individual reflectors 135 in a nanostructured LED device 101 comprising a plurality of nanostructured LEDs 100 may conveniently be formed as a continuous reflecting layer 535 covering the plurality of nanostructured LEDs 100, as schematically illustrated in FIG. 5a. The continuous reflecting layer 535 should be regarded as a plurality of individual reflectors. As seen in the figure, the continuous reflecting layer 535 does in this embodiment cover a major portion of the surface of each individual nanostructure LED. The continuous reflecting layer 535 may, as depicted fill the space between the individual nanostructured LEDs 100. Alternatively, as illustrated in FIG. 5b a fill layer 507, for example of $SiO_2$ is provided to the nanostructured LED device covering a portion of the height of the nanostructured LEDs. The continuous reflecting layer 535 can in this embodiment be described as a plurality of individual reflectors 135 of essentially concave surfaces covering the nanostructured LEDs joined with essentially flat surfaces 536 covering the fill layer 507. This solution will introduce more reflections before light is guided out, i.e. between the joining flat surfaces and the plan of a substrate or a buffer layer. This gives a trade-off between the height of the nanostructures, generating more light, and higher absorption loss from repeated reflections. Wave guiding properties of the nanostructures will however limit this effect as the emission of light with an low angle relative the elongated direction on the nanostructure will be guided so that the first reflection of a high fraction of light will be on a concave parts of the reflector.

Figure 5C:
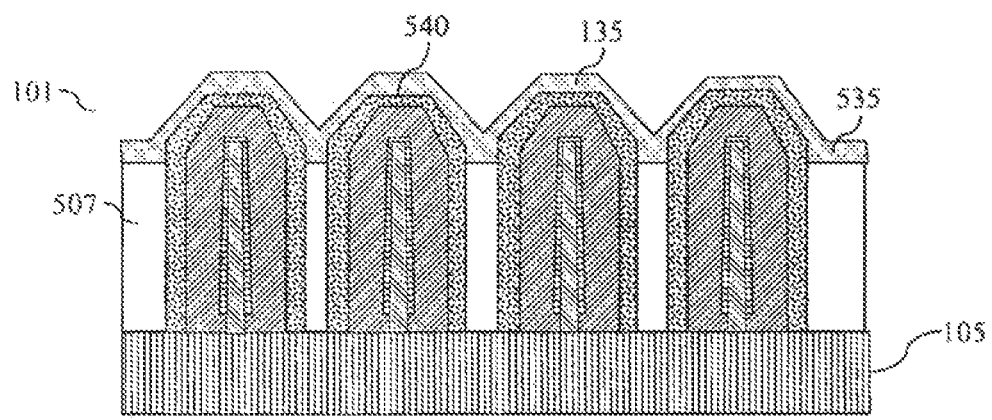

Another realization of the current invention is depicted in FIG. 5c. Individual nanostructured LEDs are provided with an electrically conducting transparent layer 540 covering the entire cylindrical surface of the nanostructured LEDs. Transparent conductive oxides (for example ITO) deposited by sputtering deposition may be used to form such a layer. Subsequently the space between the nanostructured LEDs is filled with a transparent dielectric material 507, for example $SiO_2$, $Si_3N_4$, $Al_2O_3$ leaving the tips of the LEDs exposed. Finally the reflector 535 comprising in fact a plurality of individual reflectors 135 is formed. The reflector layer forms electrical contact with transparent contact layer 540 of each nanostructured LED. This structure allows good current injection into the whole junction area while utilizing the optical properties of the reflector.

The choice of design of the nanostructured LED device for a certain application may be dependent on many parameters. In the context of light collimation and, with this also extraction and device efficiency, a pyramidal structure as descried with references to FIG. 1d, can be expected to be close to optimal since a high percentage of the emitted light will be directed downwards already at first reflection. However, the design requires a high utilization or surface area and therefore the production cost may be higher than a more elongated structure such as those depicted in FIG. 1b-d.

Figure 13A:
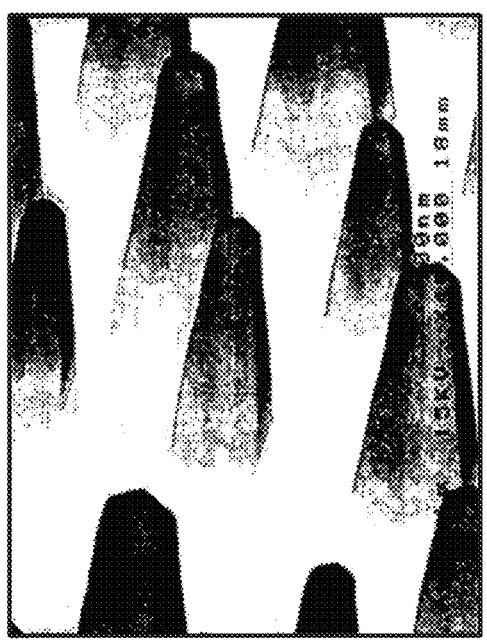
FIGS. 13A-13B show SEM images of two alternative shapes of LED structures.

Elongated pyramidal structures, as shown in FIG. 13*a*, represents a functional compromise between these parameters.

Figure 6:
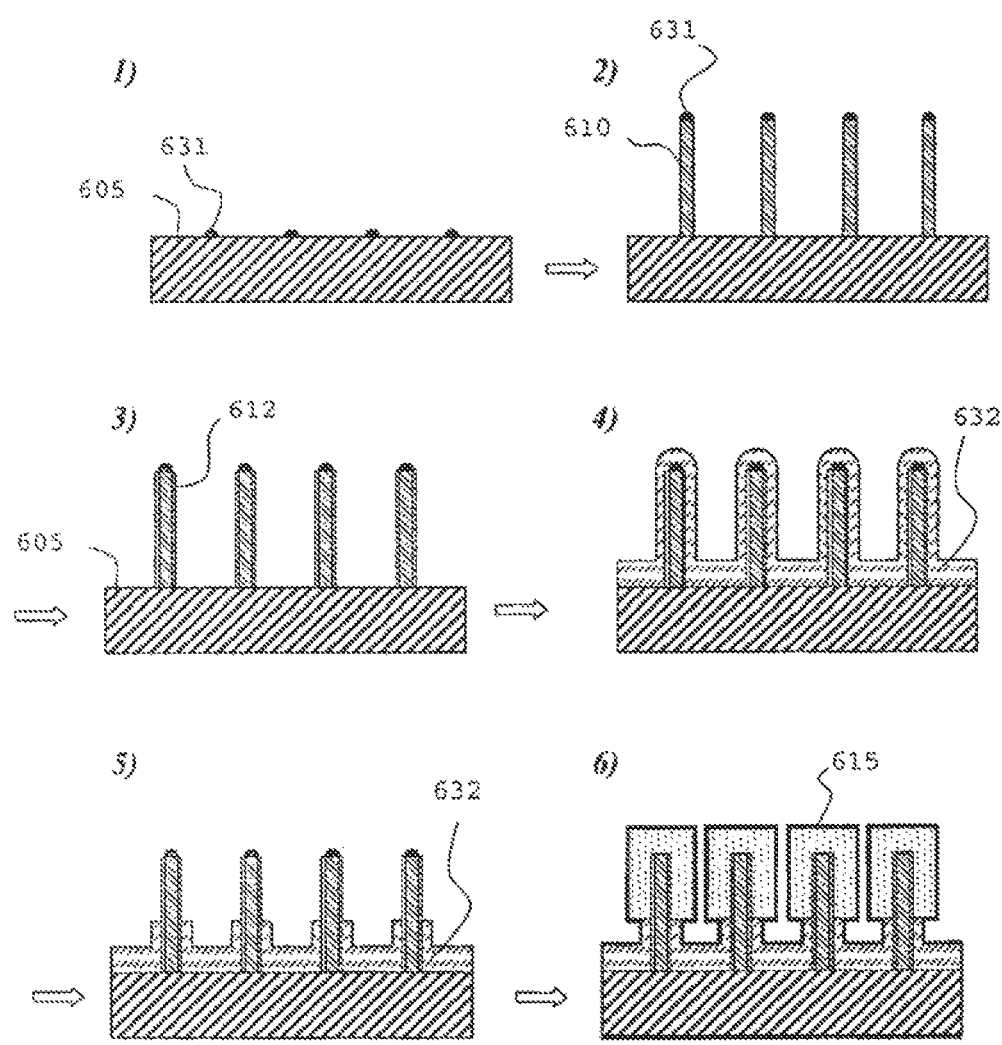
FIG. 6 illustrates the basic production steps in the method according to the invention.

A method of fabricating nanostructured LED is to first grow a nanowire, according to the above referred processes. Part of the nanowire is then masked and the volume element is re-grown selectively. The method is illustrated in FIG. 6. The volume element grows both axially and radially, hence, when the nanowire is masked partly, the nanowire becomes enclosed in the volume element. Appropriate masking materials are e.g. silicon nitride, silicon oxide etc.

Considering systems where nanowire growth is locally enhanced by a substance, as VLS grown nanowires, the ability to alter between radial and axial growth by altering growth conditions enables the procedure (nanowire growth, mask formation, and subsequent selective growth) can be repeated to form nanowire/3D-sequences of higher order. For systems where nanowire growth and selective growth are not distinguished by separate growth conditions it may be better to first grow the nanowire along the length and by different selective growth steps grow different types of 3D regions or volume elements.

A method of fabricating a nanostructured LED device according to the invention comprises the basic steps of:
a) —defining growth positions on a substrate by lithography;
b) —growing nanostructured LEDs from the substrate on the defined growth positions;
c) —depositing a reflector material at least on top of the nanostructured LEDs thereby forming individual reflectors for each nanostructured LED.

The details of the method will depend on the materials and the desired shape and functionality of the nanostructured LED device. Fabrication examples will be given below.

The method may comprise a step to be taken after the step of growing of nanostructured LEDs and prior to the step of depositing a reflector material, of forming the upper parts of the nanostructured LEDs to define the shape of the inner surface of the reflectors covering the nanostructured LEDs. Various etching or ablation methods can be utilised. Alternatively, may material be added on top of the nanostructures to define the shape for the reflectors.

Depending on the intended use of the nanostructured LED device, availability of suitable production processes, costs for materials etc, a wide range of materials can be used for the different parts of the structure. In addition the nanowire based technology allows for defect free combinations of materials that otherwise would be impossible to combine. The III-V semiconductors are of particular interest due to their properties facilitating high speed and low power electronics. Suitable materials for the substrate include, but is not limited to: Si, GaAs, GaP, GaP:Zn, GaAs, InAs, InP, GaN, Al$_2$O$_3$, SiC, Ge, GaSb, ZnO, InSb, SOI (silicon-on-insulator), CdS, ZnSe, CdTe. Suitable materials for the nanowire 110 and the volume element 115 include, but is not limited to: GaAs (p), InAs, Ge, ZnO, InN, GaInN, GaN AlGaInN, BN, InP, InAsP, GaInP, InGaP:Si, InGaP:Zn, GaInAs, AlInP, GaAlInP, GaAlInAsP, GaInSb, InSb, Si. Possible donor dopants for e.g. GaP are Si, Sn, Te, Se, S, etc, and acceptor dopants for the same material are Zn, Fe, Mg, Be, Cd, etc. It should be noted that the nanowire technology makes it possible to use nitrides such as GaN, InN and AlN, which gives facilitates fabrication of LEDs emitting light in wavelength regions not easily accessible by conventional technique. Other combinations of particular commercial interest include, but is not limited to GaAs, GaInP, GaAlInP, GaP systems. Typical doping levels range from $10^{18}$ to $10^{20}$.

A person skilled in the art is thought familiar with these and other materials and realizes that other materials and material combinations are possible.

The appropriateness of low resistivity contact materials are dependent on the material to be deposited on, but metal, metal alloys as well as non-metal compounds like Al, Al—Si, TiSi$_2$, TiN, W, MoSi$_2$, PtSi, CoSi$_2$, WSi$_2$, In, AuGa, AuSb, AuGe, PdGe, Ti/Pt/Au, Ti/Al/Ti/Au, Pd/Au, ITO (InSnO), etc. and combinations of e.g. metal and ITO can be used.

A fabrication method according to the present invention in order to fabricate a light emitting pn-diode/array with active nanowire region(s) formed of GaAs and InGaP, illustrated in FIG. 6 comprises the steps of:
1. Defining of local catalyst/catalysts on a p+GaP substrate 605 by lithography.
2. Growing GaAs nanowire 610 from local catalyst 631. The growth parameters adjusted for catalytic wire growth.
3. Radial growing of thin InGaP concentric layer 612 around the nanowire (cladding layer).
4. Depositing of SiO$_2$ as mask material 632,
5. Back etching of mask 632 to open up the upper parts of the nanowires
6. Selective growing of n+InGaP volume element 615. The growth parameters adjusted to give radial growth.
7. Forming reflectors on the volume element by depositing reflective material at least on a portion of the volume elements 615.

The growth process can be varied in known ways to for example include heterostructures in the nanowires, provide reflective layers etc. The stem 113 utilized in some embodiment can be provided by first growing a thin nanowire (step 2), depositing a reflective layer or a selective growth mask covering the lower part, and radial growing of cladding layer or the nanowire to increase the nanowire thickness.

Further examples of realizations of the nanostructured LED utilised in the nanostructured LED device according to the present invention will be given as GaAs nanowires epitaxially grown on GaP and Si substrates. The LED 1 functionality has been established on both kinds of substrates. The structures are evaluated in terms of temperature-dependent photoluminescence, electroluminescence, and radiation pattern.

A LED device according to the realisation comprises arrays of III-V light emitting nanowire diodes, grown and integrated on Si. Each device is built around a GaAs nanowire core, directly grown on either GaP or Si. A portion of each diode acts as the active region in these individual nanosized p-i-n light emitting structures.

Figure 7:
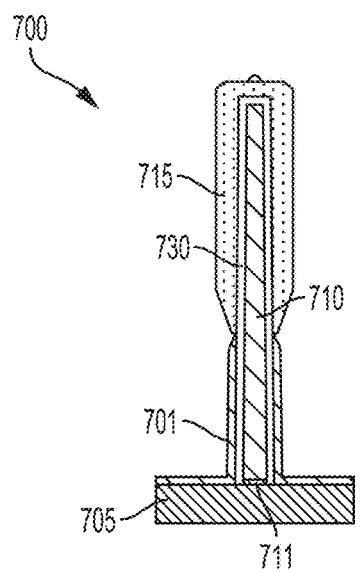
FIG. 7 schematically illustrates a LED nanostructure.

The LED device 701, shown in FIG. 7, comprises of p-i-n diode structures 700. The substrate 705 is an integral part of the device, as it functions as a common p-layer. Each nanostructured LED 700 structure comprise a nanowire 710, a cladding 730 enclosing at least a portion of the nanowire, a cap or bulb 715 and a top contact. The sequence of p-doped, n-doped and intrinsic semiconductor materials will depend on the substrate material. On GaP the structure is: p-GaP (substrate) 705, i-GaP 711/i-GaAs (nanowire) 710, i-InGaP (cladding) 730, n-InGaP (bulb) 715. On Si the structure is: p-Si(substrate) 705, i-GaP/i-GaAs (nanowire) 710, i-InGaP (cladding) 730/n-InGaP (bulb) 715. The i-GaP 711 (nanowire) layer in the nanowire base is approximately 60 nm thick in both the devices and serves the dual purposes of a nucleation segment for improved growth quality and electron barrier.

Figure 8A:
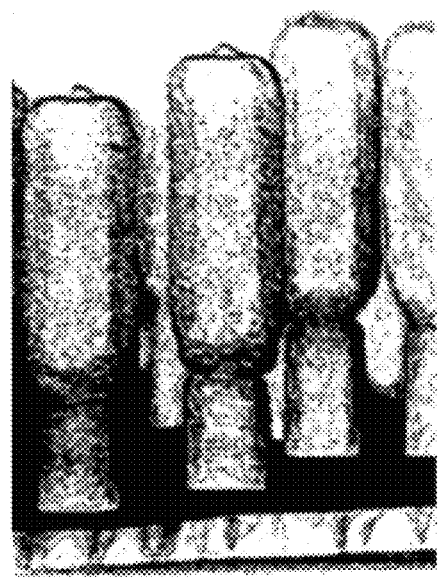
FIG. 8A is a SEM-image of a nanostructure LED according to FIG. 7.
Figure 8B:
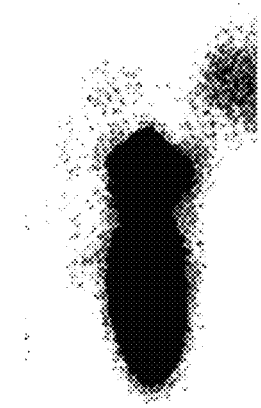
FIG. 8B is an image of an active LED nanostructure.

The fabrication process is outlined in the following. THMa metal organic sources and TMIn together with AsH$_3$, PH$_3$, and SiH$_6$ as precursor gases were used. Two growth steps were employed. First, 2 μm long GaAs/GaP nanowires were grown on p-type GaP (111)B (p=10$^{18}$ cm$^{-3}$) and Si (111) (p≈10$^{15}$ cm$^{-3}$) substrates by particle assisted growth using randomly deposited, 60 nm diameter nm sized Au aerosols with a particle density of 1/μm$^2$. The nanowires were enclosed with 40 nm thick radial InGaP cladding layer, nominally lattice matched to GaAs. After this step, samples were unloaded for photoluminescence characterization or subsequent fabrication of the nano LEDs. 80 nm thick SiO$_2$ was deposited onto the samples lined for LED fabrication. The SiO$_2$ was back etched back to only cover the substrate surface and up to approximately 1 μm of the side wall of the nanowire. The samples were then reloaded into the MOVPE reactor and a radial Si-doped InGaP layer was selectively grown on the upper part of the GaAs/InGaP core structure. The LEDs were fully covered with 150-300 nm thick 200×200 μm$^2$ quadratic Ni/Ge/Au contacts, each covering approximately 40000 individual nanostructured LEDs. The p-contact was fabricated on the backside of the substrate with conductive Ag paste. Other means of contacting, for example using transparent contacts are known in the art and easily adopted to the present method and device. A scanning electron microscopy (SEM) image of the structure is shown in FIG. 8a.

One important difference between the Si and the GaP device is the heterostructure sequence in the base of the nanowire, on GaP substrate being p-GaP (substrate)/i-GaP (nanowire)/i-GaAs (nanowire), while on Si substrate being p-Si (substrate)/i-GaP (nanowire)/i-GaAs (nanowire), and both hole injection conditions and internal resistance and should be expected to be appreciably different between the two structures.

FIG. 9 depicts nanowire structures after the first MOVPE step. Depicted are GaAs nanowires with a thin InGaP cladding layer, a GaP nucleation segment in the base of the nanowires, and with the Au based seed particle still attached to the top. Such structures were also transferred to neutral substrates for PL characterization. As shown in FIG. 9 the yield is essentially 100 percent on both GaP and Si substrates. The fabrication of the nanostructured LEDs on Si is refined to the degree that the nanowires are uniformly aligned the (111) direction normal to the substrates and essentially no nanowires are grown in the three declined (111) directions that also extends out from the substrate. This in contrast to prior art methods of III-V nanowire growth on Si(111). The well aligned growth of III-V nanowires in predefined array structures on Si substrates, as seen in FIG. 9, is a prerequisite for successful large scale fabrication of optical devices, as well as most other applications.

LED functionality can be indicated by Photoluminescence (PL) measurements. The measurements here presented were carried out at room temperature and at a temperature of 10 K. The result is illustrate in the graphs of FIGS. 10a-c and FIG. 8b. A laser emitting at 473 nm was used as an excitation source. The PL was collected by an optical microscope, dispersed through a spectrometer and detected by a liquid N$_2$ cooled CCD camera.

To study the PL from the nanowires without influence of the substrate, the nanowires were broken off and transferred from the substrate where they were grown, and then deposited on a patterned Au surface. In this way the nanowires could also be studied individually. The PL spectra, as shown in FIG. 10a, acquired at 10 K from the as-grown nanowires were similar for nanowires grown from a Si substrate and the nanowires grown from a Si substrate (Si) and the nanowires grown from a GaP substrate (GaP). The dashed lines are the spectra from (a large number of) nanowires still standing on the substrate. The spectra from individual nanowires showed larger differences, with the nanowires grown from a GaP substrate being more structured. The average PL intensity for the nanowires grown from Si was about a factor of 20 lower than for the corresponding nanowires grown from GaP. This is in fair agreement with the 10-30 times lower electro-luminance seen for the Si-LED as compared to the GaP-LED. At room temperature the spectra are broad and featureless and there is very little spectral difference between nanowires from the two samples.

Figure 11A:
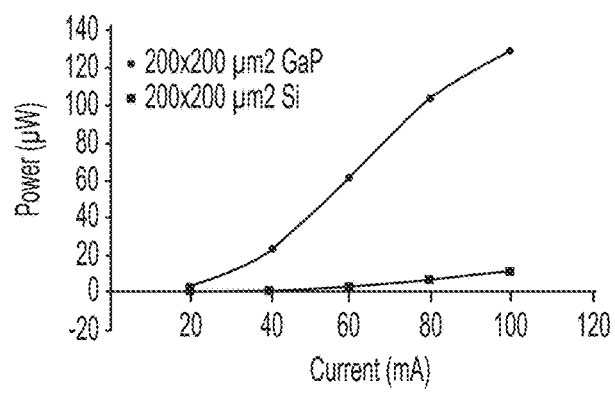
FIG. 11A shows Power dependence of Electroluminescence of GaAs LEDs grown on GaP and Si.
Figure 11B:
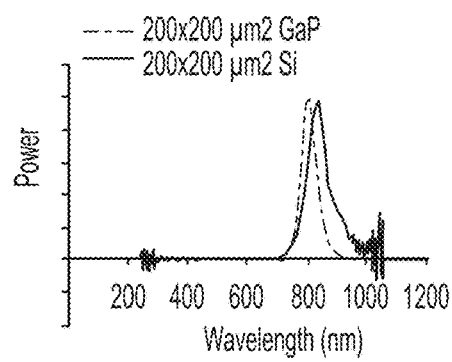
FIG. 11B is EL spectra at 80 mA from GaP and Si based LED nanostructures.

Both the LED on GaP and on Si demonstrated electroluminescence (EL) when applying a forward bias, as shown in FIGS. 11a-b. The spectral peak of the light is in fair agreement with the GaAs bandgap energy.

As seen in FIGS. 11a and b the light power/current dependence is shown for the Si based (Si) and GaP based (GaP) LEDs. The LED on GaP lights up at half the current load (20 mA) of the Si (40 mA) and at 60 mA the power output is approximately 30 times higher on the GaP substrate. However, at 100 mA the power ratio has decreased to 10 times the Si based LED. The EL spectral peak is shown for 80 mA load for both devices. The Si LED peak show a slight red shift and tail with a possible extra peak around 1.35 eV as compared to the GaP substrate device. The shift in peaks can be explained by the different In and Ga diffusion on GaP and Si leading to different InGaP composition. By pushing the devices, going to higher currents a peak power can be seen for approximately 140 mA for the GaP device. This is not seen with the Si device and may be an indication that non-radiative recombination or competing leakage mechanisms still dominate the EL at these current levels.

Figure 12A:
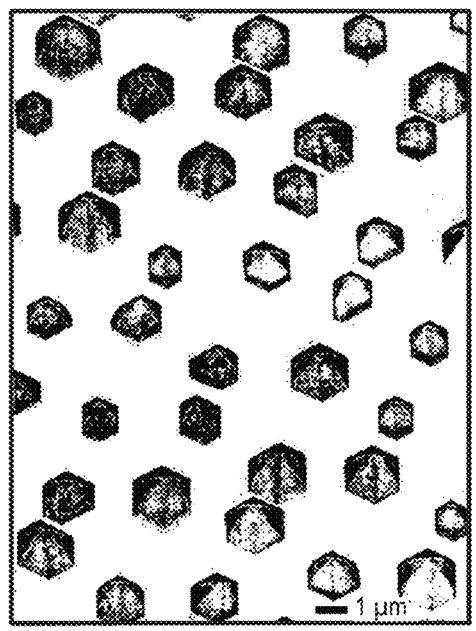
FIGS. 12A-12C show SEM images of differently shaped selectively grown nanostructures.
Figure 12B:
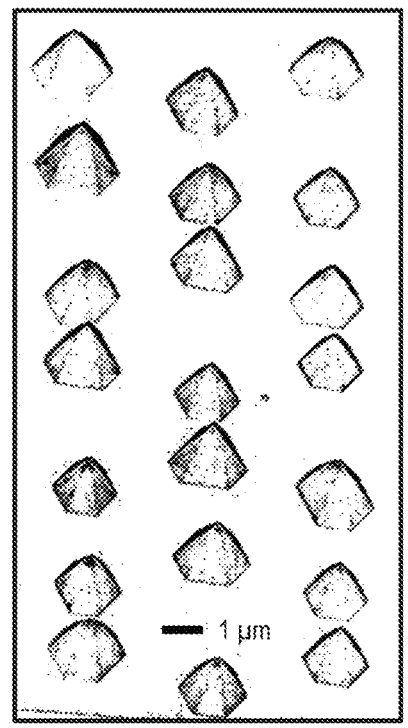
Figure 12C:
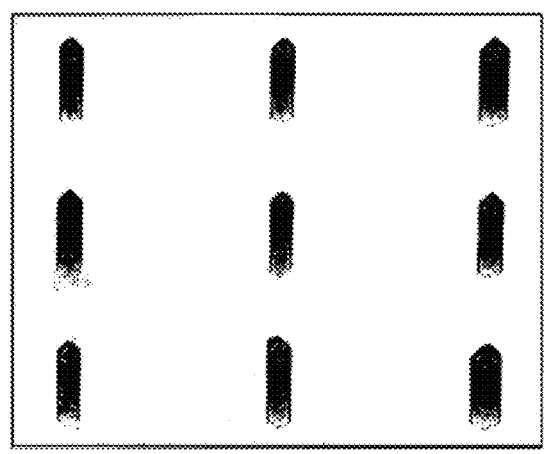
Figure 13B:
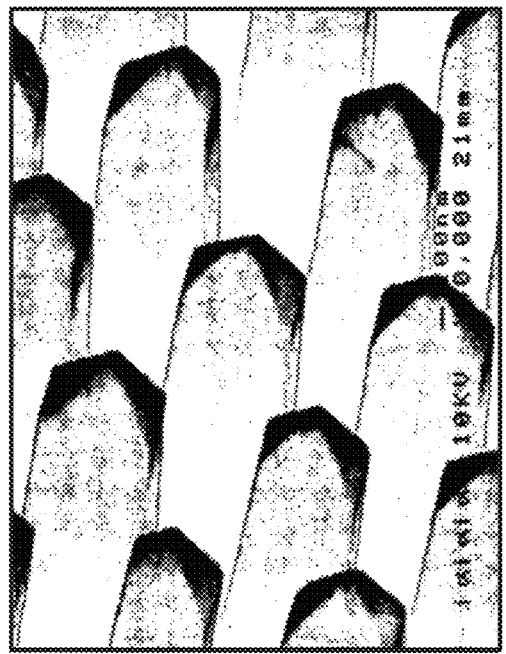

LED devices built on III-Nitrides, as GaN nanowires and nanostructures, are of high commercial interest due to their ability to produce light of wavelengths not accessible with other material combinations. As a further implementation example it is described to fabricate GaN nanostructures by selective area growth on GaN epitaxial films, sapphire, SiC or Si and even self-supporting GaN. On the starting substrate a layer of SiN$_x$ (30 nm in thickness) was deposited by PECVD. In a subsequent step, arrays of dot-patterned GaN openings (around 100 nm in diameter) were made by epitaxial beam lithography, EBL, and reactive ion etching, RIE. The pitch between the openings was ranged as 1.0~3.2 μm. Then, the as-processed samples were inserted into a, horizontal MOCVD chamber to grow GaN nanowires and GaN/InGaN nanostructured LEDs. Various shapes can be formed as shown in the SEM images of FIG. 12 a-c and FIG. 13a-b. Pyramidal structures can be formed as shown in FIGS. 12a and b. In FIGS. 12c and 13b it is illustrated that nanowires with an pyramidal ending can be formed, which is advantageous for forming an effective reflector according tot the invention. Vertical sidewalls are usually six (1101) planes. Pyramids are usually delimited by six equivalent (1101) planes but as shown in FIG. 13a higher index planes can be formed and separate index planes can be accommodated in one nanostructured LED.

While the invention has been described in connection with what is presently considered to be the most practical and preferred embodiments, it is to be understood that the invention is not to be limited to the disclosed embodiments, on the contrary, is intended to cover various modifications and equivalent arrangements within the appended claims.

The invention claimed is:

1. A method of fabricating a nanostructured LED device comprising a plurality of individual nanostructured LEDs, comprising the steps of:
   (a) defining growth positions on a substrate by lithography;
   (b) growing semiconductor nanowires of a first conductivity type from the substrate on the defined growth positions, growing well active regions over the semiconductor nanowires, and growing semiconductor volume elements of a second conductivity type over the well active regions to form the individual nanostructured LEDs on the defined growth positions, each individual nanostructured LED having a p-i-n junction;
   (c) depositing an electrically conductive, transparent indium tin oxide layer over the individual nanostructured LEDs; and
   (d) depositing a continuous reflector layer having a plurality of concave portions on the electrically conductive, transparent indium tin oxide layer at least over a top of the individual nanostructured LEDs, wherein each of the concave portions of the continuous reflector layer is associated with an individual nanostructured LED of the plurality of individual nanostructured LEDs.

2. The method of fabricating a nanostructured LED according to claim 1, further comprising a step, to be taken after the step of forming the individual nanostructured LEDs and prior to the step of depositing the continuous reflector layer, of forming upper parts of the nanostructured LEDs to define a shape of an inner surface of the reflectors covering the nanostructured LEDs.

3. The method of fabricating a nanostructured LED according to claim 2, wherein the step of forming the upper parts of the nanostructured LEDs comprises removing a material from the upper parts of the nanostructured LEDs prior to the step of depositing the continuous reflector layer to provide the nanostructured LEDs with a predetermined shape.

4. The method of claim 1, wherein the individual nanostructure LEDs have a pyramidal structure.

5. The method of claim 1, wherein the plurality of individual nanostructured LEDs comprise waveguides adapted to direct at least a portion of emitted light towards the individual reflectors of each individual nanostructured LED.

6. The method of claim 1, wherein the plurality of individual nanostructured LEDs form an array that forms a photonic crystal arranged to inhibit a wavelength of the light emitted from active regions of the array in a direction close to a plane of the array.

7. The method of claim 1, wherein the nanostructured LED device is bottom emitting.

8. The method of claim 1, wherein depositing the electrically conductive, transparent indium tin oxide layer over the individual nanostructured LEDs covers entire surfaces of the LEDs.

* * * * *